(12) United States Patent
Foss

(10) Patent No.: US 7,266,747 B2
(45) Date of Patent: Sep. 4, 2007

(54) ERROR CORRECTION SCHEME FOR MEMORY

(75) Inventor: Richard Foss, Calabogie (CA)

(73) Assignee: Mosaid Technologies Incorporated, Kanata, Ontario (CA)

( * ) Notice: Subject to any disclaimer, the term of this patent is extended or adjusted under 35 U.S.C. 154(b) by 537 days.

(21) Appl. No.: 10/694,761

(22) Filed: Oct. 29, 2003

(65) Prior Publication Data

US 2004/0117723 A1   Jun. 17, 2004

Related U.S. Application Data

(60) Provisional application No. 60/429,556, filed on Nov. 29, 2002.

(51) Int. Cl.
*H03M 13/00* (2006.01)
(52) U.S. Cl. .................................. 714/755
(58) Field of Classification Search .............. 714/755, 714/758, 805
See application file for complete search history.

(56) References Cited

U.S. PATENT DOCUMENTS

| | | | |
|---|---|---|---|
| 4,183,463 A | 1/1980 | Kemmetmueller | |
| 4,456,980 A | 6/1984 | Yamada et al. | |
| 4,679,196 A | 7/1987 | Tsujimoto | |
| 4,688,219 A | 8/1987 | Takemae | |
| 4,747,080 A | 5/1988 | Yamada et al. | |
| 4,768,193 A | 8/1988 | Takemae | |
| 4,901,320 A | 2/1990 | Sawada et al. | |
| 4,942,575 A | 7/1990 | Earnshaw et al. | |
| 5,127,014 A | 6/1992 | Raynham | |
| 5,134,616 A | 7/1992 | Barth, Jr. et al. | |
| 6,125,466 A | 9/2000 | Close et al. | |
| 6,185,718 B1 | 2/2001 | Dell et al. | |
| 6,233,717 B1 | 5/2001 | Choi | |
| 6,353,910 B1 | 3/2002 | Carnevale et al. | |

OTHER PUBLICATIONS

P. Mazumder, "An On-Chip ECC Circuit for Correcting Soft Errors in DRAM's with Trench Capicitors", IEEE Journal of Solid-State Circuits, vol. 27, No. 11, Nov. 1992, pp. 1623-1633.

(Continued)

*Primary Examiner*—Guy J. Lamarre
(74) *Attorney, Agent, or Firm*—Shin Hung; Borden Ladner Gervais LLP

(57) ABSTRACT

An embedded DRAM ECC architecture for purging data errors. The embedded DRAM ECC architecture is based upon a two-dimensional linear parity scheme, and includes a plurality of memory blocks and a parity block. Each memory block includes additional columns for storing row parity bits, and the parity block stores column parity bits. A row parity circuit coupled in parallel to an existing local databus of each memory checks the parity of the local databus bits against a row parity bit during a refresh or read operation to identify parity failure. Identification of the incorrect bit of the word is achieved by iteratively transferring the data of the local databus of each memory block onto an existing global databus, and checking the parity across the global databus with a column parity circuit. When global databus parity failure is detected, all bits of the global databus are inverted to purge the incorrect bit from the memory block via the local databus.

22 Claims, 14 Drawing Sheets

OTHER PUBLICATIONS

ISSCC 83, Friday, Feb. 28, 1983, Imperial Ballroom A, 11:45am., Session XVI: 256K DRAMs, "FAM 16,6: Submicron VLSI Memory Circuits", T. Mano, J. Yamada, J. Inoue, S. Nakajima, 1983 IEEE International Solid-State Circuits Conference.

ISSCC 84, Wednesday, Feb. 22, 1984, Continental Ballrooms 6-9, 4:30pm, Session VIII A: 256K 1Mb DRAMs I, "WPM 8A.5: A Submicron VLSI Memory with a 4b-at-a-Time Built-in ECC Circuit", J. Yamada, T. Mano, J. Inoue, S. Nakajima, T. Matsuda, 1984 IEEE International Solid-State Circuits Conference.

ERROR CORRECTION SCHEME FOR MEMORY

This application claims priority from U.S. Application No. 60/429,556 filed Nov. 29, 2002, the contents of which are herein entirely incorporated by reference.

FIELD OF THE INVENTION

The present invention relates generally to memory devices. More particularly, the present invention relates to error detection and correction for embedded DRAM memories.

BACKGROUND OF THE INVENTION

Modern PDA products and combination cell phone/PDA products, referred from this point forward as portable devices, require substantial amounts of memory. While many portable devices are assembled with multiple discrete components, cost and performance pressures point to single-chip system on chip (SoC) implementations as the optimal solution. Such applications, like most other semiconductor devices, tend to be built on high-volume standard processes, such as standard logic processes to keep fabrication costs under control.

For consumers, battery life of portable devices is a primary concern, hence power consumption of the portable device should be kept as low as possible. Moreover, these portable devices preferably operate on very low power in standby mode. While many functions can be shut down in standby mode, memory cannot be lost. Thus the optimal approach is to use some form of non-volatile memory. Unfortunately, Flash memory is not presently compatible with standard logic processes, and ferro-electric memories are not presently a high-volume standard process.

Therefore, the most promising and practical memory for portable devices is DRAM, and more specifically embedded DRAM (eDRAM) for SoC implementations. There is already a clear trend for embedding DRAM compatible with standard logic processes into SoC products. The advantages are demonstrated in products that can be made smaller, consume less power while operating faster than their discrete component system counterparts. Although SRAM memory can be used, SRAM memory arrays consume more silicon area than a DRAM memory array of the same density.

As known to those of skill in the art, DRAM requires periodic refreshing of its data, which contributes to power consumption. Hence portable devices having eDRAM can benefit if the period between refresh operations is extended as much as possible. In the standby mode of the portable device, battery life can be extended by minimizing refresh power consumption.

Unfortunately, the reliability of an embedded DRAM to operate properly generally requires some minimum capacitance value for memory cell charge storage. Reliability in the memory context commonly refers to the ability of a memory cell to retain the logic level written to it. The logic state of a DRAM memory cell can change due to leakage of its stored charge over time, or due to random alpha particle hits, either of which can result in system errors. Furthermore, different DRAM cells can leak charge at different rates. The refresh interval is thus set to accommodate the fastest leaking DRAM cell, and cannot be overly extended to save power.

Data reliability is a problem that has been addressed in the telecommunications and mass storage fields, where wireless transmissions are susceptible to signal degradation and mass storage media such as compact discs and computer hard disk drives routinely encounter read errors. The detection and correction of "bad bits" of data to improve reliablity is achieved through Error Correction Coding (ECC) techniques. Many ECC techniques and coding schemes are well known in the art, and therefore do not require further description.

Accordingly, ECC has been used in memory systems, and over the years papers have appeared describing a variety of memory chips including the function within the chip. Most are based on "Hamming" codes, Modified Hamming, or Reed-Solomon codes. The additional silicon area consumption and impact upon performance due to added overhead limit such chips to very specific applications, and hence have not seen widespread commercial use. These issues become more serious, when seeking to apply ECC to a compiled embedded memory where the size and word length of the memory are, by definition, variable. Hence an ECC scheme tailored for one particular embedded memory configuration may not apply to an embedded memory having a different configuration. Those of skill in the art should understand that a compiled embedded memory is produced with the aid of computer software tools through which designers can specify memory bank sizes, the number of memory banks, and other parameters, to suit a specific application.

A published ECC scheme for standard memory devices that showed some promise was a two-dimensional linear parity encoding scheme. FIG. 1 illustrates the principle of two-dimensional linear parity encoding with a 16 by 16 memory cell array. To simplify the illustration, wordlines, bitlines or peripheral circuits such as bitlines and column access devices are not shown. Memory array 20 is composed of memory cells arranged in rows and columns, where each square 22 represents a memory cell. This configuration is well known in the industry. One additional row and column of memory cells are added to memory array 20, where the additional row is a parity row 24 and the additional column is a parity column 26. Hence, if a rectangular array of memory cells can be checked for parity in orthogonal directions, the intersection of the failing lines defines a bad bit. In the example shown in FIG. 1, the row of a bad bit 28 can be identified by checking the parity of its associated row of memory cells against the parity column bit 30 in the same row. Correspondingly, the column of bad bit 28 can be identified by checking the parity of its associated column against the parity row bit 32 in the same column. Therefore bad bit 28 can be identified for correction of its data. Moreover, any two bad bits in the array can be detected and corrected so long as no two bad bits appear on the same line.

Known methods for implementing the two-dimensional linear parity encoding scheme for DRAM were found to be clumsy, adding excessive amounts of wide bussing as well as the ECC circuitry itself. Although the increase in chip size due to the added parity rows and columns is unavoidable, the increase due to the additional wide bussing and ECC circuitry further reduced the cost effectiveness and advantages of adding the error correction capability.

Another problem inherent to most memory ECC schemes is their inability to correct, or purge, the memory cell identified with the faulty data. If the data is corrected only at read out, then the memory array will accumulate bad bits over time. Although some schemes then purge the memory cell with corrected data, they can do so only during a read access. Hence bad bits can accumulate in between read access operations, especially if the interval between read access operations is long. Naturally, error correcting at read out also impacts device performance due the additional logic overhead of the ECC circuits.

It is, therefore, desirable to provide a memory ECC architecture that occupies minimal silicon chip area, and performs error detection and purging with minimum impact upon device performance.

SUMMARY OF THE INVENTION

It is an object of the present invention to obviate or mitigate at least one disadvantage of previous ECC schemes. In particular, it is an object of the present invention to provide an error detection and purging system for a memory that occupies a minimum silicon area, and can automatically detect and purge errors in a self-contained manner such that detection and purge operations are transparent to the user or external system.

In a first aspect, the present invention provides an error detection system for a memory. The error detection system includes a memory block for storing a data word and a corresponding row parity bit, and a row parity circuit for receiving the data word and the corresponding row parity bit from the memory block in response to a memory block access operation, for comparing parity of the data word against the corresponding row parity bit. The row parity circuit generates an active local parity fail flag in response to parity failure.

In an embodiment of the present invention, the error detection system further includes a local data I/O circuit for coupling the data word between the memory block and a global databus, and for coupling the corresponding row parity bit between the memory block and the row parity circuit. The row parity circuit can include a serial parity chain for receiving the data word from the local data I/O circuit and for providing a parity output corresponding to parity of the local data, and a sense circuit for receiving the parity output and the corresponding row parity bit. The row parity circuit provides the active local parity fail flag if the logic state of the parity output and the logic state of the local row parity bit mismatch. In an aspect of the present embodiment, the serial parity chain includes an even parity line driven to a first logic level at one end thereof, and an odd parity line driven to a second logic level at one end thereof. The parity output is provided from the other end of the even parity line, and each parity circuit includes cross-over transistors for coupling the parity output to one of the first and second logic levels. In a further aspect of the present embodiment, the sense circuit can include a cross-coupled latch for receiving and latching the parity output, and a comparator circuit for comparing the latched parity output to the local row parity bit.

In other aspects of the present embodiment, the comparator circuit includes an exclusive OR gate, the sense circuit includes switching means for coupling the latched parity output to the memory block during a write operation, the serial parity chain is segmented into at least two serially connected sub-parity circuits, and the memory block includes one of redundant rows and columns, and corresponding redundancy circuits.

In another embodiment of the present invention, the error detection system further includes a parity block and a column parity circuit. The parity block stores a column parity word where each bit of the column parity word represents column parity for a corresponding bit position of the data word. The column parity circuit is coupled to the local data I/O circuit and the parity block for receiving the data word and the column parity word, and for comparing column parity of each bit position of the data word to a corresponding bit of the column parity word in response to the active local parity fail flag. The column parity circuit inverts data of each bit position of the data word that fails column parity. In an aspect of the present embodiment, the memory block, the row parity circuit, the parity block and the column parity circuit are integrated in an embedded DRAM.

In an aspect of the present embodiment, the parity block has a configuration identical to that of the memory block, and a parity block data I/O circuit for coupling the word of column parity bits between the parity block and the column parity circuit. The column parity circuit can include a multiplexor circuit, a parity block multiplexor circuit, a parity evaluator circuit, and a global dataline inverting circuit. The multiplexor circuit is coupled between the local data I/O circuit and the global databus for receiving the bits of the data word and for iteratively providing each bit of the data word to the global databus. The parity block multiplexor circuit is coupled to the parity block data I/O circuit for receiving the bits of the column parity word and for providing one bit of the column parity word in each iteration. The parity evaluator circuit is coupled to the global databus for receiving the one bit of the column parity word, and for comparing parity of the global databus to the one column parity bit in each iteration and generating an active global parity fail flag in response to column parity failure. The global dataline inverting circuit receives and then inverts data of the global databus in response to the active global parity fail flag.

In embodiments of the present aspect, the multiplexor circuit and the parity block multiplexor circuit can each include a counter for controlling operation thereof, the parity evaluator circuit can include a serial parity chain and a sense circuit, and the global dataline inverting circuit can include a flip-flop. The serial parity chain is coupled to the global databus for providing a parity output corresponding to parity of the global databus. The sense circuit receives the parity output and the one bit of the column parity word, for providing the active local parity fail flag if the logic state of the parity output and the logic state of the one bit of the column parity word mismatch. The flip-flop has an input coupled to a global dataline, an output coupled to a complementary global dataline, a complementary output coupled to the global dataline, and a clock input for receiving the active global parity fail flag.

In yet another embodiment of the present invention, the error detection system further includes a column parity check circuit for selectively changing bits of the column parity word on the global databus in a write operation, for writing a new word to an address of the data word stored in the memory block. The column parity check circuit includes a parity comparison circuit and a parity inverting circuit. The parity comparison circuit stores the data word and the new word and compares each bit position of the stored data word to each corresponding bit position of the stored new word. The parity comparison circuit provides a mismatch flag signal for each bit position having mismatching logic states. The parity inverting circuit is coupled to the global databus for receiving the mismatch flag signals, and for inverting the logic state of the global dataline pairs in response to the corresponding received mismatch flag signals.

In further embodiments of the present invention, the memory can be a DRAM, an SRAM, or an FeRAM, and the memory block access operation can be a DRAM refresh operation or a data purge operation.

In a second aspect, the present invention provides a method of detecting and purging bit errors in a memory. The method includes executing a read operation to read a data word and corresponding row parity bit from a memory block of the memory, comparing row parity of the data word against the corresponding row parity bit and generating a row parity fail flag in response to row parity failure, comparing column parity of each bit of the data word against a corresponding bit of a column parity word stored in a parity block of the memory, in response to the row parity fail flag, and inverting bits of the data word that fail column parity.

In an embodiment of the present aspect, the step of executing includes suppressing the data word from global I/O circuits and providing the data word and the corresponding row parity bit to a local databus.

In other embodiments of the present aspect, the step of comparing row parity can include executing a row parity check of the local databus against the corresponding row parity bit, the step of comparing column parity can include iteratively multiplexing bits of the data word from the local databus to a corresponding global databus line in response to row failure, the step of comparing column parity can include executing a column parity check of the global databus against a corresponding column parity bit in each iteration, and the step of comparing column parity can include inverting the data bits of the global databus if column parity failure is detected in each iteration.

In further embodiments of the present aspect, the step of inverting can include inverting the data bit of a local databus line coupled to one of the global databus lines for purging the bit error of the data word stored in the memory block, and the step of iteratively multiplexing can include selectively activating column access transistors for coupling a different local databus line to the corresponding global databus line in each iteration. The step of selectively activating can include incrementing a counter to address and activate a different column access transistor in each iteration, and maintaining activation of the column access transistor corresponding to the memory block having row parity failure. In yet further embodiments of the present aspect, the background read operation can include a refresh operation or a data purge operation.

In a third aspect, the present invention provides an error detection and purging system for a memory. The system includes a plurality of memory blocks for storing data words and corresponding row parity bits, one of the memory blocks being a parity block for providing a column parity word, a local data I/O circuit coupled to each memory block for transferring the data words to global datalines, a row parity circuit and a column parity circuit. The row parity circuit is coupled to the local data I/O circuit of each memory block for receiving the data words and the corresponding row parity bits in a memory block access operation, and compares parity of the data words against the corresponding row parity bits for generating a corresponding active local parity fail flag in response to row parity failure. The column parity circuit is coupled to all the local data I/O circuits, the global databus, and the parity block for receiving the data words and the column parity word. The column parity circuit iteratively transfers a bit from each of the data words to a different global dataline for comparing parity of the global datalines to a corresponding bit of the column parity word. The column parity circuit then inverts data of the global databus in response to column parity failure in each iteration.

In an embodiment of the present invention, each row parity circuit can include a serial parity chain for receiving the data word from the local data I/O circuit and for providing a parity output corresponding to parity of the data word, and a sense circuit for receiving the parity output and the corresponding row parity bit, for providing the active local parity fail flag if the parity output and the corresponding row parity bit mismatch. The serial parity chain can include an even parity line driven to a first logic level at one end thereof, and an odd parity line driven to a second logic level at one end thereof, where the parity output is provided from the other end of the even parity line, and each parity circuit includes cross-over transistors for coupling the parity output to one of the first and second logic levels. The sense circuit can include a cross-coupled latch for receiving and latching the parity output, and a comparator circuit for comparing the latched parity output to the local row parity bit. The comparator circuit can include an exclusive OR gate.

In another embodiment of the present invention, each memory block includes one of redundant rows and columns, and corresponding redundancy circuits.

In yet another embodiment of the present invention, the parity block has a configuration identical to that of each memory block, and a parity block data I/O circuit for coupling bits of the column parity word to the column parity circuit.

In an aspect of the present embodiment, the column parity circuit can include a multiplexor circuit, a parity block multiplexor circuit, a parity evaluator circuit, and a global dataline inverting circuit. The multiplexor circuit is coupled between each local data I/O circuit and the global databus for receiving the bits of the data word in parallel and for iteratively providing each bit of the data word to the global databus. The parity block multiplexor circuit is coupled to the parity block data I/O circuit for receiving the bits of the column parity word in parallel and for providing one bit of the column parity word in each iteration. The parity evaluator circuit is coupled to the global databus for receiving the one bit of the column parity word, where the parity evaluator circuit compares parity of the global databus to the one column parity bit in each iteration and generates an active global parity fail flag in response to column parity failure. The global dataline inverting circuit receives and inverts data of the global databus in response to the active global parity fail flag. The multiplexor circuit and the parity block multiplexor circuit can each include a counter for controlling operation thereof, and the global dataline inverting circuit can include a flip-flop having an input coupled to a global dataline, an output coupled to a complementary global dataline, a complementary output coupled to the global dataline, and a clock input for receiving the active global parity fail flag.

In another aspect of the present embodiment, the error detection and purging system further includes a column parity check circuit for selectively changing bits of the column parity word on the global databus in a write operation, for writing a new word to an address of the data word stored in the memory block. The column parity check circuit includes a parity comparison circuit and a parity inverting circuit. The parity comparison circuit stores the data word and the new word and compares each bit position of the stored data word to each corresponding bit position of the stored new word. The parity comparison circuit provides a mismatch flag signal for each bit position having mismatching logic states. The parity inverting circuit is coupled to the global databus for receiving the mismatch flag signals and for inverting the logic state of the global dataline pairs in response to the corresponding received mismatch flag signals.

In a fourth aspect, the present invention provides a method for writing row and column parity bits to a memory system in a write operation, the memory system having a memory block for storing a data word and a corresponding row parity bit, and a parity block for storing column parity bits. The method includes latching a stored data word read out from an address to which a new data word is to be written, writing the new data word to the address and generating a corresponding row parity bit, comparing data between each bit position of the stored data word and the new word, and inverting the column parity bits corresponding to mismatching bit positions.

In embodiments of the present aspect, the step of latching includes reading the stored data word onto a global databus, and the step of writing includes latching the new data word.

In another embodiment of the present aspect, the step of inverting includes reading the column parity bits onto a global databus and inverting the column parity bits of the global databus that correspond to bits of the stored data word that mis-match bits of the new data word.

In yet another embodiment of the present aspect, the method further includes a memory initialization step prior to the step of latching. The memory initialization step includes writing preset logic values to memory cells of an activated wordline, reading out the preset logic values for latching by bitline sense amplifiers, and activating all wordlines of the memory block to write the latched preset logic values thereto. In aspects of the present embodiment, the step of reading includes disabling bitline precharge and equalize circuits after the preset logic values are latched by the bitline sense amplifiers, and the step of activating includes iteratively activating individual wordlines by addressing each wordline with a refresh counter. Multiple wordlines or all the wordlines can be simultaneously activated. The activated wordline can include a master wordline and the step of writing includes activating all column access devices to write the preset logic value to all the memory cells coupled to the master wordline.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached FIGS., wherein.

DETAILED DESCRIPTION

An embedded DRAM ECC architecture for purging data errors is disclosed. The embedded DRAM ECC architecture is based upon a two-dimensional linear parity scheme, and includes a plurality of memory blocks and a parity block. Each memory block includes additional columns for storing row parity bits, and the parity block stores column parity bits. A row parity circuit coupled in parallel to a local databus of each memory checks the parity of the local databus bits against a row parity bit during a refresh or read operation in order to identify row parity failure for the word. Identification of the incorrect bit of the word is achieved by serially shifting the data of the local databus of each memory block onto a global databus, and checking the column parity across the global databus with a column parity circuit. When global databus parity failure is detected, all bits of the global databus are inverted to purge the incorrect bit from the memory block via the local databus.

In addition to detecting and purging bit failures, the presently disclosed ECC architecture can generate and write row and column parity bits as data words are written to the memory blocks. A method of rapid initialization of the cells of the memory blocks using an existing refresh counter prior is also disclosed. Therefore, the presently disclosed ECC architecture for purging data errors is a fully self-contained, autonomous system that does not require external processing of parity data from another system such as an off chip microcontroller or an on chip processing block Prior to the discussion of the ECC architecture embodiments of the present invention, a common DRAM array is described below to provide contextual background for the upcoming description of the ECC components.

Figure 1:
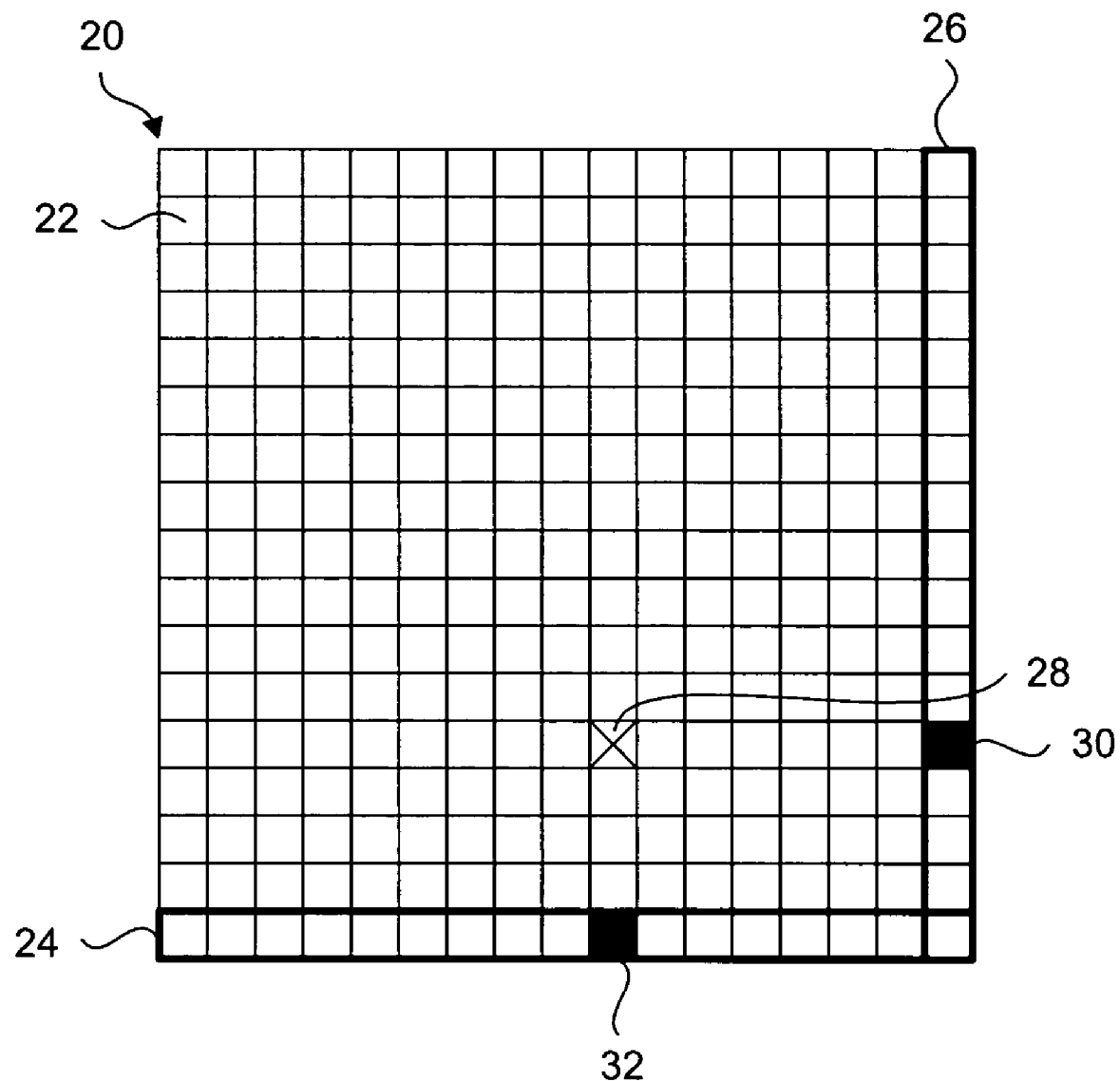
FIG. 1 is a simplified illustration of a typical memory array.
Figure 2:
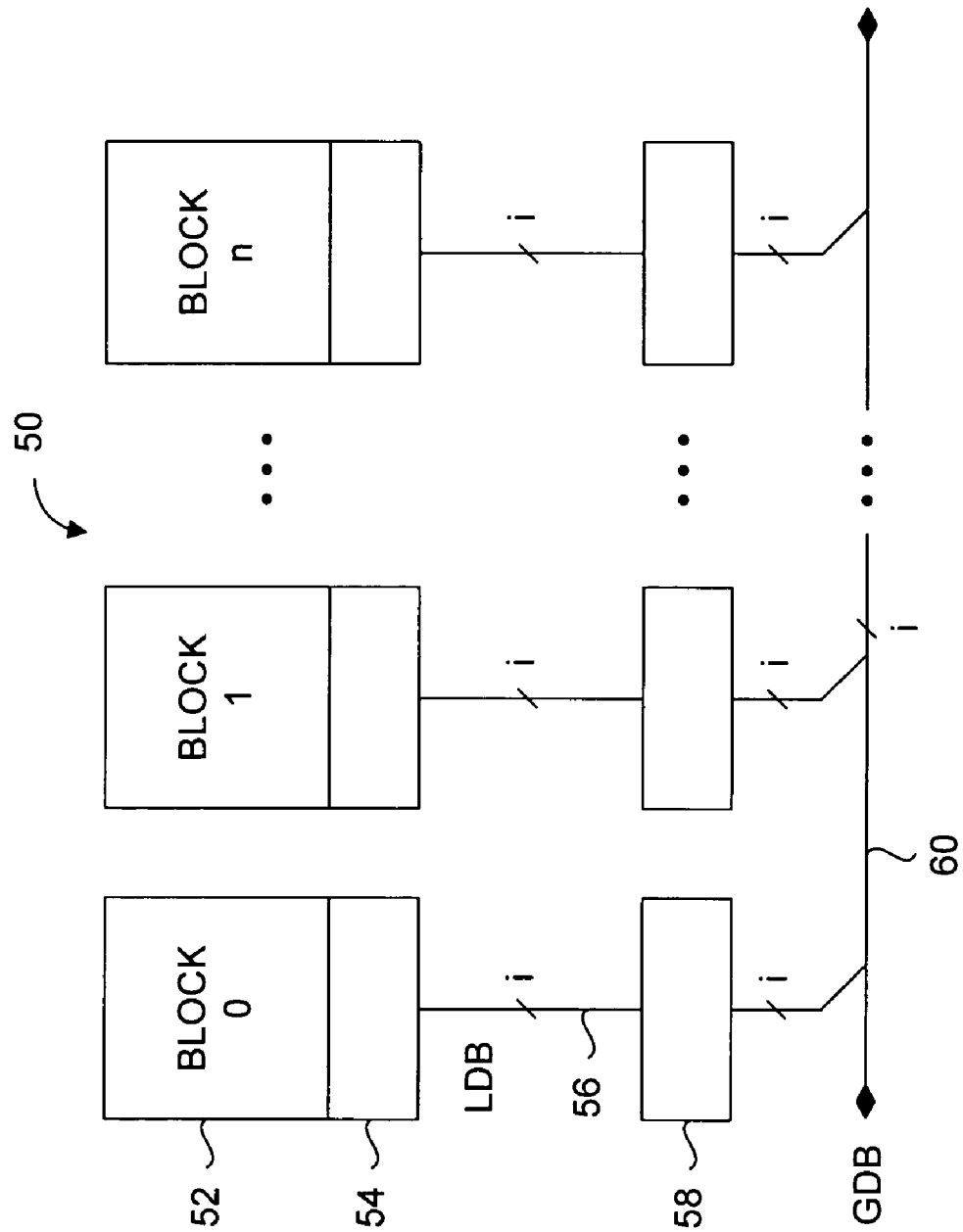
FIG. 2 is a block diagram of a typical memory architecture.

FIG. 2 is a block diagram illustrating the common components of a DRAM array. The layout of the memory blocks represents the conceptual architecture and is not intended to represent the practical layout of the device. Memory array 50 comprises of n memory blocks 52, where n is an integer number greater than 1. Each memory block 52 includes a local data I/O circuit consisting of an associated first stage column access devices 54, local databus 56, and second stage column access devices 58. Each memory block 52 consists of memory cells, such as DRAM cells for example, arranged in rows and columns, where each row of cells is coupled to a wordline and each column of cells is coupled to a bitline. Each set of first stage column access devices 54 selectively couples a predetermined number of bitlines to the local databus 56, and each set of second stage column access devices 58 can be selectively enabled, or activated, to couple their respective local databus 56 to global databus 60. Additional spare rows and columns of memory cells can be included in each memory block 52 to replace those rows or columns of memory cells that are found to be defective. Accordingly, the associated redundancy circuitry required for disabling the defective rows and columns, enabling a spare row or column, and addressing the spare row or column would be included in the memory device. Such redundancy schemes are well known in the art. Although not discussed or shown, those of skill in the art will understand that memory array 50 includes standard circuits to enable proper operation of the memory, but are not shown in FIG. 2 to simplify the schematic. These standard circuits can include input-output buffers, row and column decoders, and pitch limited peripheral circuits such as row drivers and bitline sense amplifiers for example. It should be apparent to those of skill in the art that local databus 56 and global databus 60 include a predetermined number of pairs of complementary datalines.

An example of a possible configuration of memory array 50 follows. Memory array 50 is divided into 16 memory blocks 52, where each memory block 52 has columns divided into 32 groups consisting of 4 columns per group. A master wordline is coupled to corresponding wordlines of each memory block 52 for simultaneous activation of the same logical wordline in one or more of the memory blocks 52. There can be any desired number of wordlines in memory blocks 52. The first stage column access devices 54 perform a 1 of 4 column select in each group to populate 32 local databus line pairs with data. The second stage column access devices 58 perform a 1 of 16 block select to couple all 32 local databus line pairs of one memory block 52 to 32 global databus line pairs of GDB 60. Naturally, the first and second stage column access devices are controlled by well known column decoder circuits.

To read data from memory array 50, a master wordline is activated and memory cells coupled to each wordline segment of the master wordline drive their respective bitlines, or column, with their stored data. Once sensed by bitline sense amplifiers, the first stage column access devices 54 couple selected bitlines to the local databus 56. The second stage column access devices 58 then selectively couple the local databus 56 of one memory block 52 to the global databus 60. The global databus 60 then carries the data to other circuits of the system. The bitlines, local databus and global databus can be precharged after the read operation is completed or prior to the next read operation.

The relative independence from precise array and word sizes in the previously described DRAM memory array 50 makes it attractive for embedded DRAM devices, such as application specific integrated circuits (ASICs). Incorporating known DRAM schemes such as the use of segmented wordlines and wide databus architectures allows for an attractive implementation of two-dimensional parity. According to an embodiment of the present invention, the inherent wide local and global databus of a memory array can be advantageously used for parity checking in addition to standard data read and write operations.

Figure 3:
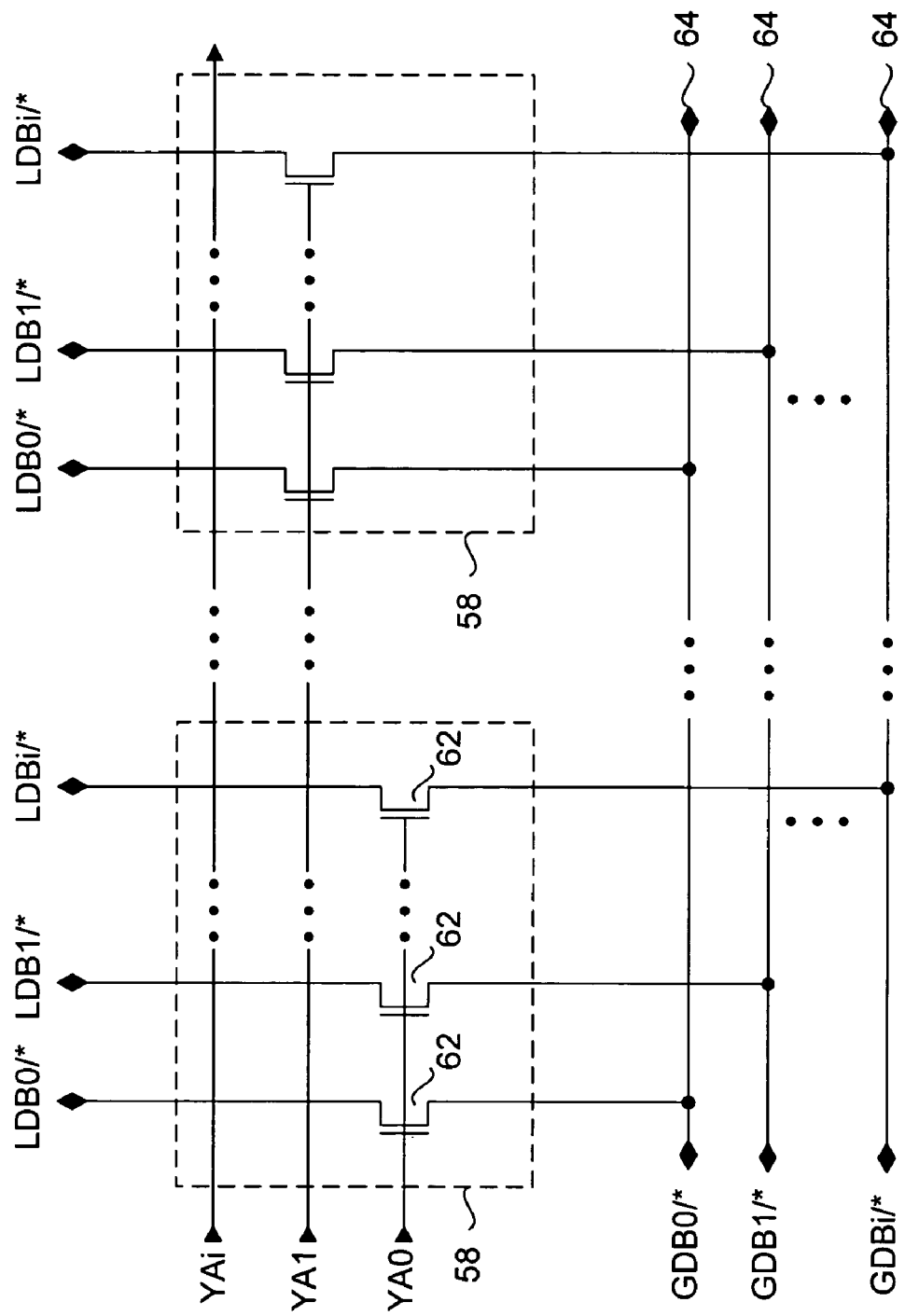
FIG. 3 is a circuit schematic of the second stage column access block of FIG. 2.

FIG. 3 is an example of a circuit implementation of second stage column access devices 58 shown in FIG. 2. Two second stage column access device blocks 58, one associated with a respective memory block 52, are shown. Each second stage column access device block 58 includes a plurality of column access transistors 62 for coupling a local databus line to a global databus line 64. Although only one local databus line is shown connected to one column access transistor 62, it should be understood by those of skill in the art that each column access transistor 62 represents a pair of transistors coupled to a true and a complementary databus line. The true and complementary local databus lines are labelled as LDB0/*, LDB1/* etc. Preferably, each global databus line 64 includes a pair of individual complementary databus lines, having the same naming convention as the local databus lines. In the present example, the column access transistors 62 of the same second stage column access device block 58 couple one pair of local databus lines to a pair of global databus lines 64. In the present scheme, each second stage column access device block 58 is controlled by a single column select signal to simultaneously couple all its local databus lines to the global databus lines. Hence only the data from one memory block 52 is coupled to the global databus lines 64. It is well understood that the number of column access transistors, local and global databus lines depends upon the specific memory configuration, and that standard column decoder circuits generate the appropriate column access control signals YA0 to YAi. For example, when YA0 is at the high logic level, LDB0/* to LDBi/* are coupled to GDB0/* to GDBi/*.

Figure 4:
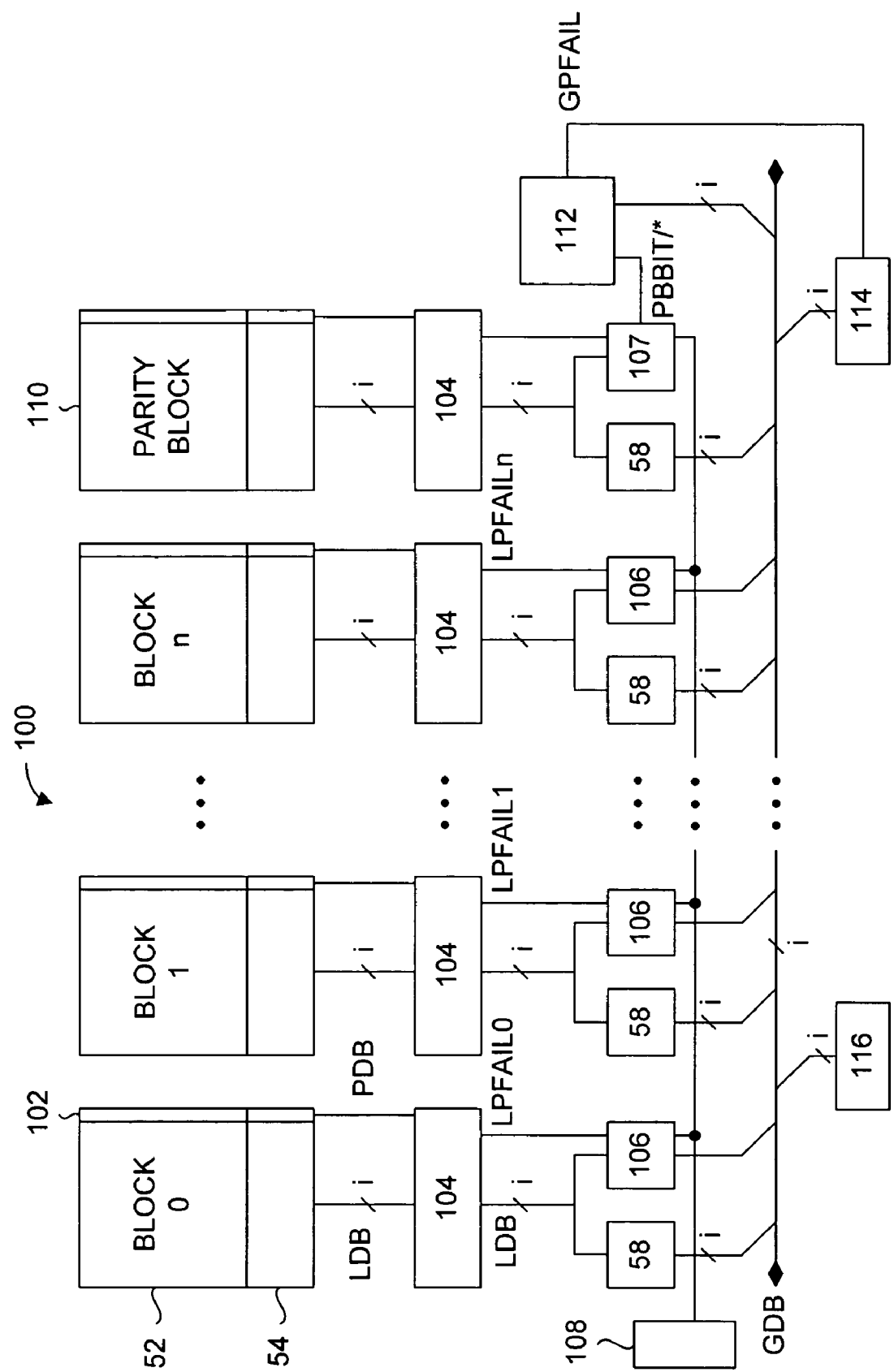
FIG. 4 is a block diagram of the ECC architecture according to an embodiment of the present invention.

FIG. 4 is a block diagram showing an error detection and purging memory system 100 according to an embodiment of the present invention. The memory array includes the same components as those shown in FIG. 2, but now includes additional elements for enabling error detection and correction. These include parity columns 102, a parity block 110, a row parity circuit coupled in parallel to the local data I/O circuit of each memory block, and a column parity circuit coupled to all the local data I/O circuits and the global databus. The row parity circuit includes a parity evaluator circuit 104, while the column parity circuit includes barrel shift decoder/multiplexor circuits 106 and 107, a counter 108, a parity evaluator circuit 112, a global databus inverting circuit 114, and a column parity check circuit 116. ECC memory system 100 can determine row parity failure for a word being read out or refreshed through the local databus lines, meaning that the system has identified a word containing at least one bad bit. The position of the bad bit is identified through the global databus lines and corrected by inverting all the bits of the global databus lines. Control circuits ensure that only the local databus line corresponding to the identified bad bit position remains coupled to a corresponding global data bus line. Thus the corrected bad bit of the word can be rewritten back to memory. The presently disclosed error detection and purging system for memory does not require wide bussing for transferring corrected data back to the memory blocks, hence minimizing silicon area occupied by memory system 100. Standard row and column redundancy can be implemented in memory system 100 without little to no additional design overhead since error detection and correction, according to the embodiment of the present invention, is performed upon the local and global databuses.

Each memory block 52 now includes an additional set of columns 102, called parity columns for storing row parity bits. A parity bit databus PDB, carries a bit of data from the parity columns to a parity evaluator circuit 104. In FIG. 4, the LDB is denoted as having i pairs of local databus lines, where i pairs of local databus lines carry normal data, while the PDB bus is an additional pair of local databus lines for carrying one row parity bit.

The parity evaluator circuit 104 is coupled in parallel to the local databus LDB for performing an exclusive OR function across the local databus, and comparing the result to the logic state of the row parity bit provided by the parity bit databus PDB. In otherwords, parity evaluator circuit 104 detects the presence of a bad bit in the word, but does not indicate the bit position of the bad bit. The barrel shift decoder/multiplexing circuit 106 is provided for executing a barrel shift of data from the local databus of each memory block to the global databus GDB. The counter 108 provides sequential address information to the barrel shift decoder/multiplexing circuit 106 of each memory block 52 for serially coupling each of its local databus lines to one global databus line.

Parity block 110 is at least the same size and configuration as each memory block 52 for storing column parity bits. The parity block 110 has its own set of first stage column access devices 58, local databus LDB, parity evaluator circuit 104, second stage column access devices 54 and barrel shift decoder/multiplexing circuit 107. The components associated with parity block 110 function in the same way as the components of memory blocks 52, with the same logical wordline as the memory blocks being activated simultaneously with activation of a master wordline. The barrel shift decoder/multiplexing circuit 107 associated with the parity block 110 barrel shifts data from its local databus to the parity evaluator circuit 112, which is also coupled in parallel to the global databus GDB.

Since barrel shift decoder/multiplexing circuits 106 and 107 operate sequentially, counter 108 can provide the appropriate addressing signals to barrel shift decoder/multiplexing circuits 106 and 107. As an alternative implementation, each barrel shift decoder/multiplexing circuit 106 and 107 can each include its own counter for providing the appropriate addressing signals. Those of skill in the art will understand that counter 108 can, by example, be a 5-bit counter to provide address signals for controlling 1 of 32 different column access transistors of the barrel shift decoder/multiplexing circuits 106 and 107. In general, counter 108 can be an n-bit counter, where n is selected for the specific memory configuration to be used. The parity evaluator circuit 112 performs an exclusive OR function across the global databus GDB, and compares the result to the logic state of a column parity bit provided by the barrel shift decoder/multiplexing circuit 107. In otherwords, parity evaluator circuit 112 detects the specific bit position of the word that is the bad bit.

Each global databus line GDB is connected to the global databus inverting circuit 114 which is responsive to the GPFAIL output of the parity evaluator circuit 112 for inverting all the data carried by the global databus. Each global databus line is further connected to column parity check circuit 116 for selectively changing bits of a column parity word read from parity block 110 during a data word write operation. Details of column parity check circuit 116 are discussed later.

Using the previously described example memory array configuration, if each memory block 52 has columns divided into 32 groups of 4 columns each, then the set of parity columns 102 is at least one additional group of columns. In the present example, parity columns 102 includes 4 columns since each group of the block includes 4 columns. Accordingly for the present example, the first stage column access devices 54 selectively couples one of the parity columns to the parity bit databus, which is in effect one complementary pair of datalines, and one column from each group of columns to a respective local databus line. It is noted that the number of cells per bitline, or column, does not impact the scheme, and can be set by the desired cell-to-bit capacitance ratio. Accordingly, each memory block has 33 LDB pairs, and the entire ECC memory system 100 has 32 GDB pairs. If the memory array includes 16 memory blocks 52 plus the parity block 110, then 16 wordline segments (one segment per memory block) are gated from a master wordline. The wordline segment length can be set by technology, e.g. the build-up of polysilicon line resistance. The number of segments in part determines the cell overhead as a parity wordline segment from the parity block 110 will also be fed from the master wordline. The cell overhead for the presently disclosed example is approximately 9%.

Examples of the error detection and purging memory system 100 shown in FIG. 4 will now be described.

Figure 5:
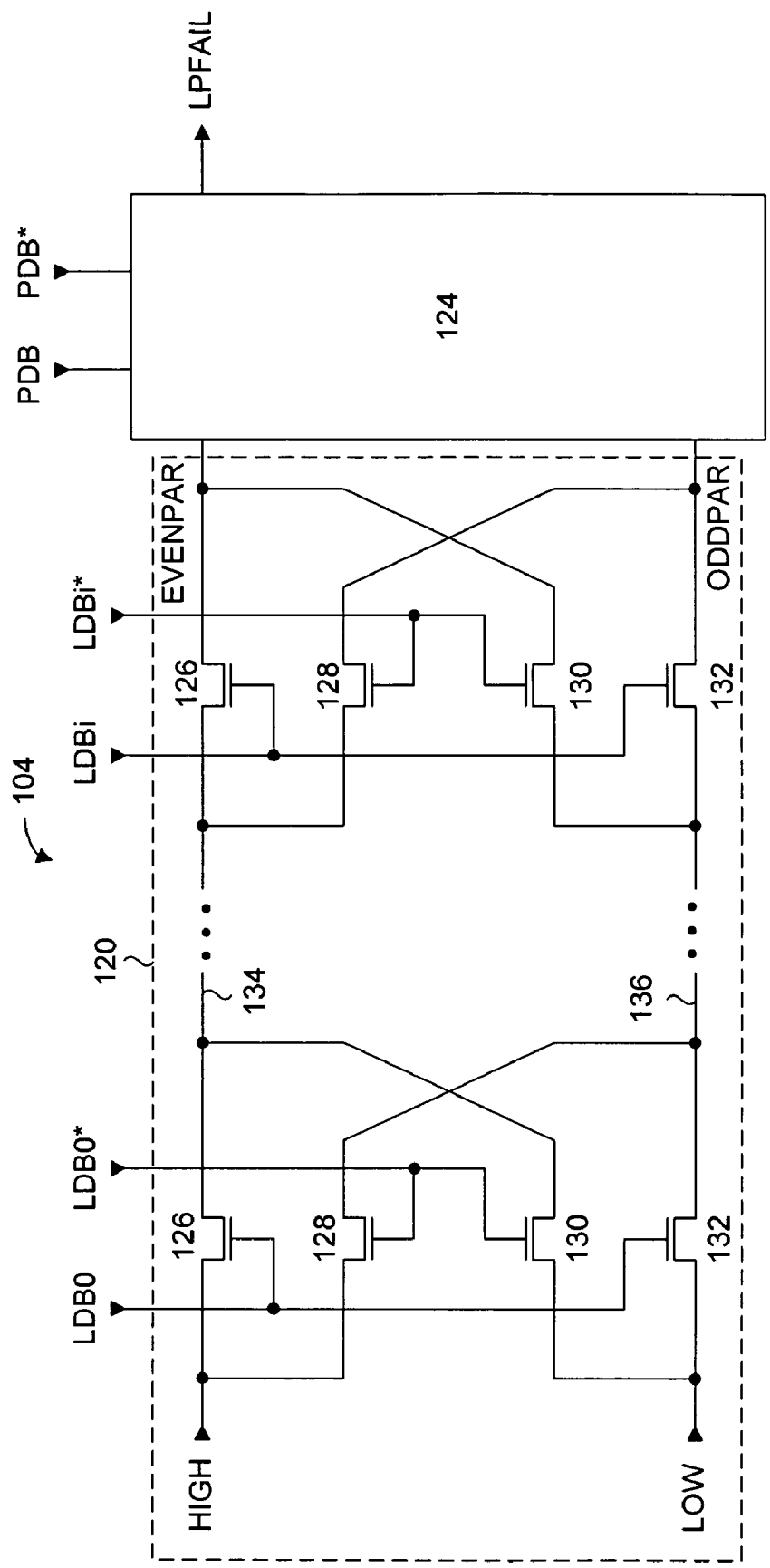
FIG. 5 is a circuit schematic of the local parity circuit of FIG. 4.

FIG. 5 shows a circuit schematic example of the parity evaluator circuit 104 shown in FIG. 4. Parity evaluator circuit 104 includes a serial parity chain 120 coupled to a comparator circuit 124. Each LDB pair is connected to four n-channel transistors 126, 128, 130 and 132 within serial parity chain 120. The serial parity chain 120 includes two parity lines 134 and 136, where one is connected to a high logic level signal and the other is connected to a low logic level signal at one end thereof. The four n-channel transistors 126, 128, 130 and 132 connected to the two parity lines 134 and 136 perform a switch-over function depending upon the logic states of the local databus lines they are connected. For example, LDB0 is at the high logic level and LDB0* is at the low logic level, transistors 126 and 132 will be turned on while transistors 128 and 130 remain turned off. Hence HIGH is coupled to the next set of four n-channel transistors connected to the next pair of local databus lines. Otherwise, transistors 126 and 132 will be turned off while transistors 128 and 130 are turned on if LDB0 is at the low logic level and LDB0* is at the high logic level. In this situation, parity line 134 is coupled to LOW and parity line 136 is coupled to HIGH. Hence HIGH and LOW propagate along parity lines 134 and 136, to appear as signals EVENPAR and ODDPAR at the inputs of comparator circuit 124. Comparator circuit 124 then compares the logic states of EVENPAR and ODDPAR to the logic states of the row parity bit provided via PDB and PDB*. The result of this comparison appears as signal LPFAIL. LPFAIL is local to each memory block 52 and can be used to inform the system that a particular memory block 52 has encountered parity failure. Those of skill in the art will understand that any desired number of 4-transistor sets of n-channel transistors can be used in serial parity chain 120. Furthermore, those of skill in the art will understand that p-channel transistors and complementary transistor transmission gates can be used in place of the n-channel transistors shown in FIG. 5.

Figure 6:
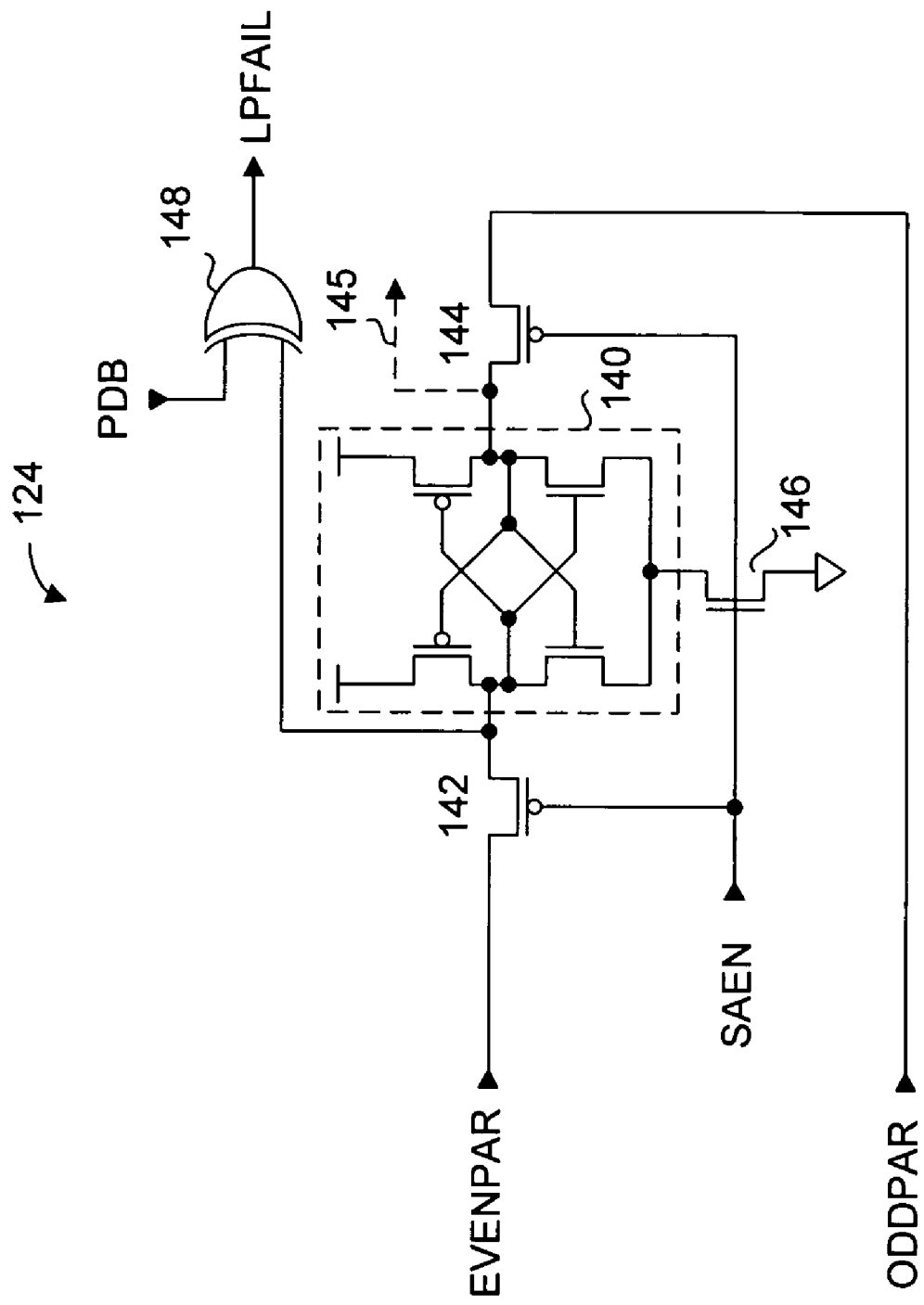
FIG. 6 is a circuit schematic of the sense circuit shown in FIG. 5.

FIG. 6 is a circuit schematic example of a circuit that can be used as comparator circuit 124 in FIG. 5. Comparator circuit 124 includes a standard cross-coupled latch 140, also known as a sense circuit, parity line isolation devices 142 and 144, sense enable transistor 146, and a comparator logic, such as XOR gate 148. Input EVENPAR is connected to transistor 142 and input ODDPAR is connected to transistor 144, and their respective voltage levels are connected to comparator circuit 124 when sense amplifier enable signal SAEN is at the low logic level. Comparator circuit 124 latches the logic levels of EVENPAR and ODDPAR when SAEN falls to the high logic level, and the logic level of EVENPAR is then XOR'd with the logic level of PDB by XOR gate 148. In the present example, comparator circuit 124 drives LPFAIL to the high logic level when local parity failure is detected. The present circuit compares the logic state of one parity line with the logic state of one PDB line. In alternative embodiments, additional logic can be added to the circuit of FIG. 6 to compare the presently unused output 145 of sense circuit 140 to the unused PDB* dataline (not shown). Many different sense circuits are known in the art that are suitable for sensing the voltage or current level of EVENPAR and ODDPAR, which can be used instead of the circuit shown in FIG. 6.

As will be discussed later, row parity circuit 104 can be used for generating a row parity bit corresponding to a written word. Because EVENPAR represents the parity of a word received by its serial parity chain 120 via the global databus and local databus, its output can be written back to its memory block 52. The comparator circuit of FIG. 6 can be modified to include switching means, such as gating devices, to switch PDB from the input of XOR gate 148 to the output of sense circuit 140, and to disconnect the output of sense circuit 140 from the other input of XOR gate 148 during write operations.

In an alternate circuit configuration, the serial parity chain 120 can be segmented to include sub-parity circuits. In otherwords, the parity lines 134 and 136 can be segmented and sensed by another latch circuit 140, with the result being provided to the next segment. In this segmented embodiment, the output of the sub-parity circuit latch drives one of the parity lines of the next sub-parity circuit. This alternative configuration can minimize the cumulative delay in the parity chain when compared to a parity chain having non-segmented parity lines.

Figure 7:
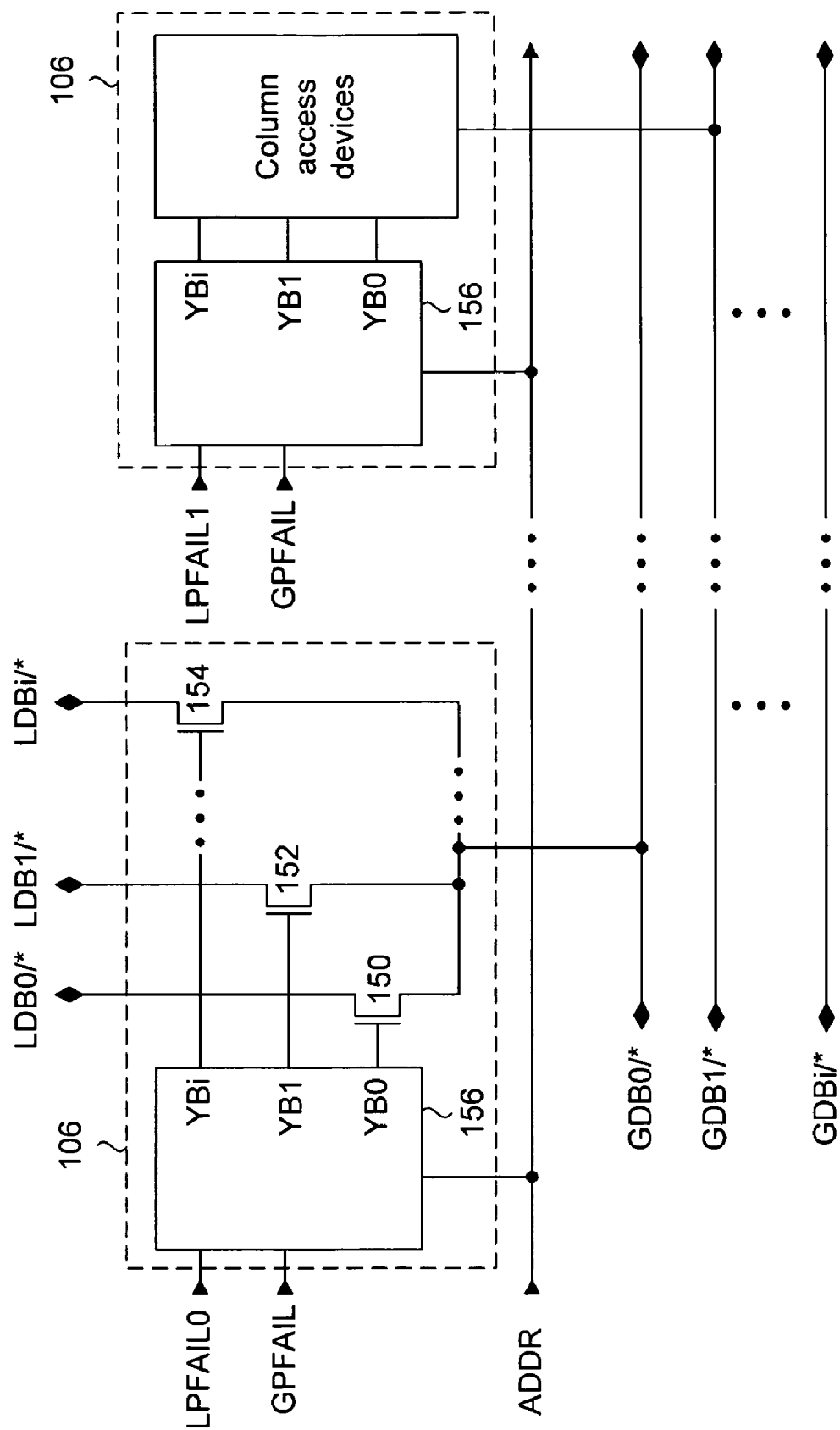
FIG. 7 is a circuit schematic of the barrel shift decoder/multiplexor circuit shown in FIG. 4.

FIG. 7 shows a schematic and arrangement of the barrel shift decoder/multiplexor circuit 106 from FIG. 4. Two barrel shift decoder/multiplexor circuits 106 are shown in FIG. 4. The leftmost barrel shift decoder/multiplexor circuit 106 includes column access transistors 150, 152 and 154, each controlled by a different column access signal, such as YB0, YB1 and YBi. Column access signals are generated by decoder circuit 156, which receives local parity fail signal LPFAIL0, global parity fail signal GPFAIL and addresses ADDR provided by the counter 108 of FIG. 4. Decoder circuit 156 activates one column access signal at a time to sequentially couple each LDB pair to GDB0/*. The rightmost barrel shift decoder/multiplexor circuit 106 is identical to the leftmost circuit, but receives a different local parity fail signal LPFAIL1 and sequentially couples each of its LDB pairs to GDB1/*. The column access devices are not shown in the rightmost circuit to simplify the schematic. Accordingly, the barrel shift decoder/multiplexor circuit 106 for each memory block 52 sequentially couples each of its LDB pairs to a different GDB pair.

Figure 9:
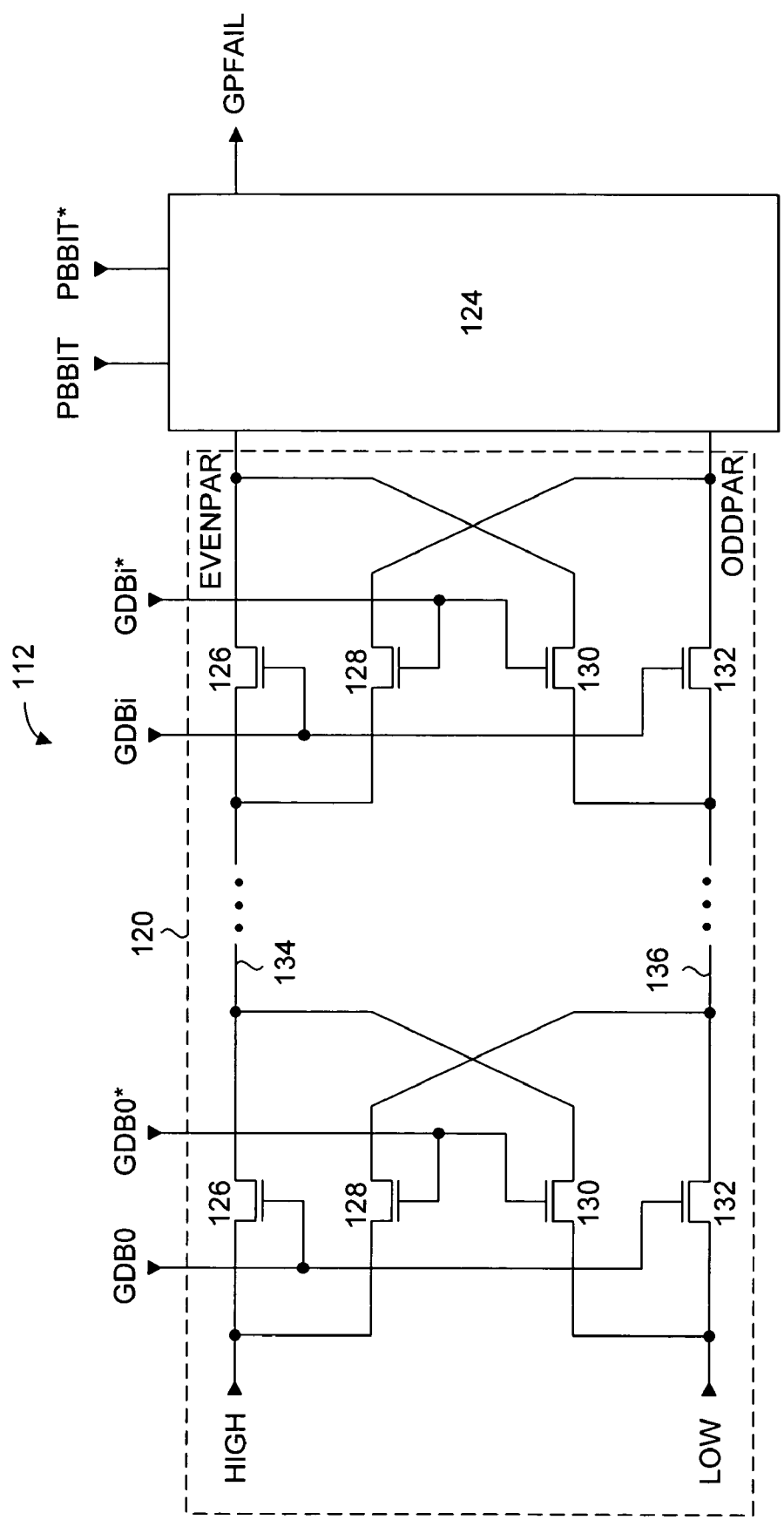
FIG. 9 is a circuit schematic of the global parity circuit shown in FIG. 4.
Figure 10:
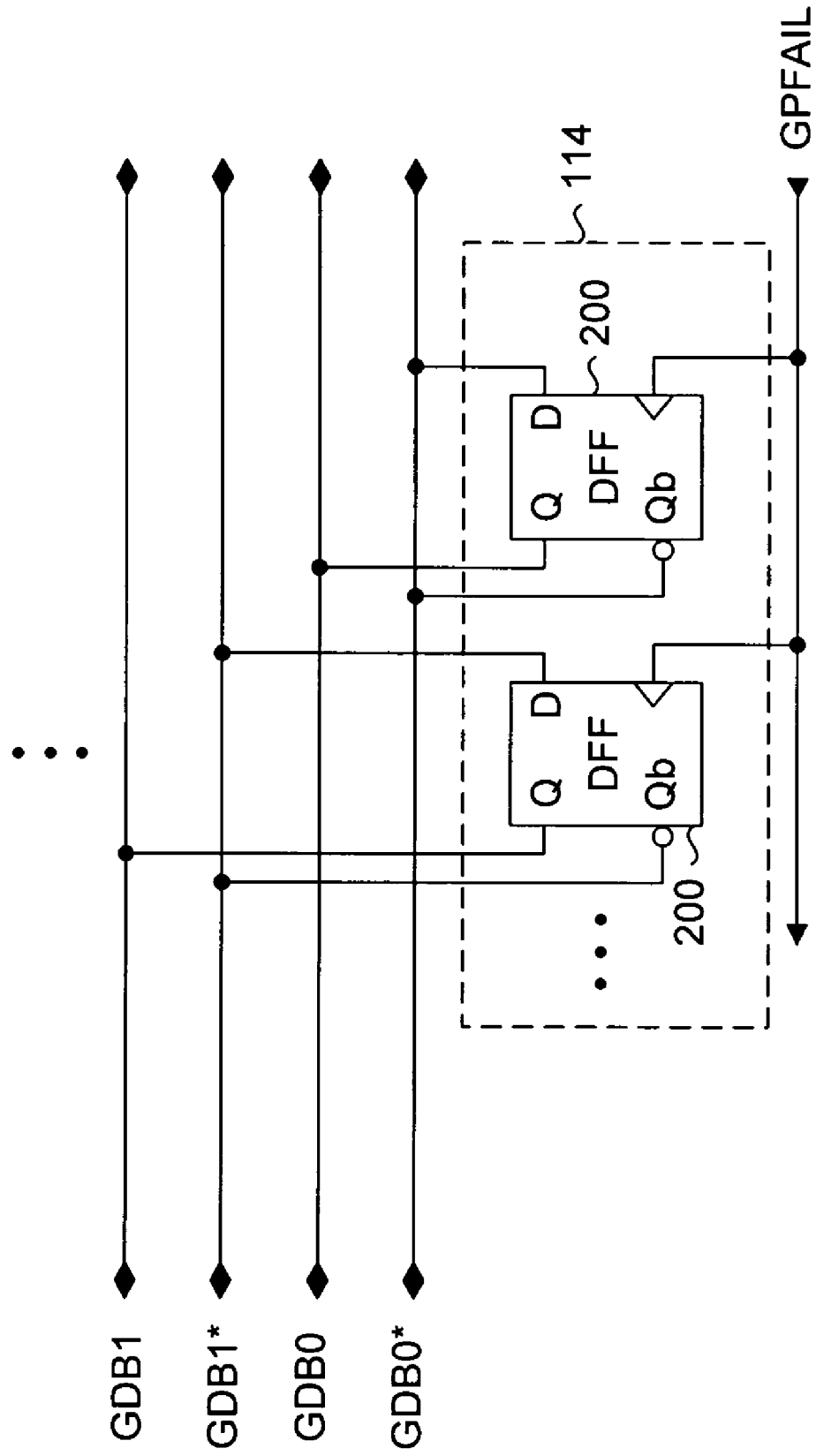
FIG. 10 is a circuit schematic of the global databus inverting circuit shown in FIG. 4.

As previously mentioned, all the GDB pairs are inverted when the global parity circuit detects parity failure. Therefore, each decoder circuit 156 has the ability to maintain its currently selected column access device turned on. However, because only the memory block 52 having the local parity failure is to have its bad bit inverted, the LDB pairs of the memory blocks 52 without local parity failure are preferably decoupled, or isolated, from their respective GDB pairs before all the GDB pairs are inverted when the global parity failure is detected. Hence the local parity fail and global parity fail signals can be used to logically ensure that only the decoder circuit 156 associated with the memory block 52 having the local parity failure has its LDB pair inverted. Examples of circuits to perform this function are shown in FIGS. 9 and 10.

Figure 8:
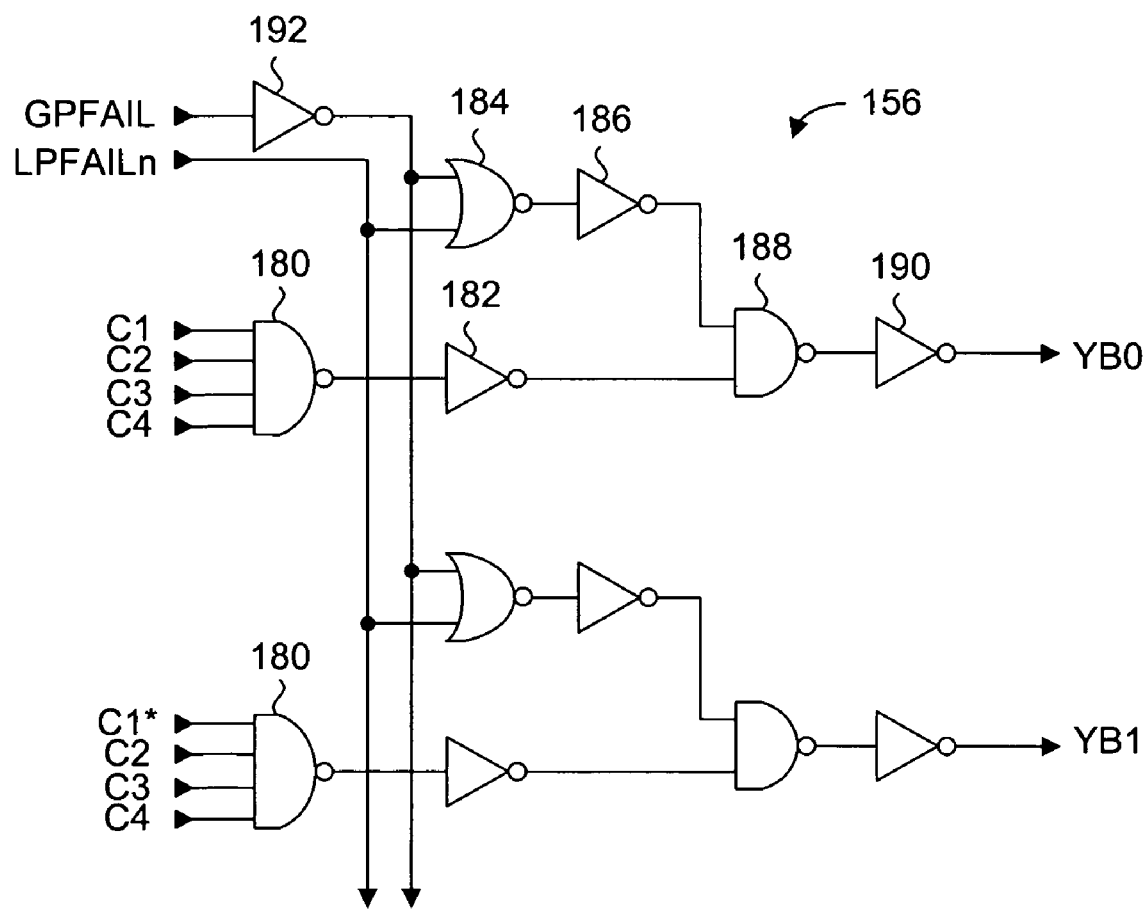
FIG. 8 is a circuit schematic of the decoder circuit shown in FIG. 7.

FIG. 8 shows a circuit schematic of a decoder circuit 156 that can be used in FIG. 7. In the present example, decoder circuit 156 receives counter signals C1 to C4 and their complements, C1* to C4* to provide 1 of 16 column access transistor selection, the global parity fail signal GPFAIL, and the local parity fail signal LPFAILn, for activating a specific column access signal and keeping it activated when both GPFAIL and LPFAILn are at logic levels indicative of parity failure. Thus the decoder circuits 156 associated with memory blocks that do not have a local parity failure will be deactivated.

A first NAND gate 180 receives counter signals C1, C2, C3 and C4 for providing its output to inverter 182. NOR gate 184 receives input signal GPFAIL via inverter 192 and LPFAILn, and has its output inverted by inverter 186. NAND gate 188 receives the outputs of inverters 182 and 186, and drives the input of inverter 190 for generation of column access signal YB0. Additional column access signals are generated by identical sub-circuits having the same configuration as gates 180 to 190, but with different counter inputs. For example, second NAND gate 180 receives counter signals C1*, C2, C3 and C4. It is noted that LPFAILn is the local parity fail signal generated by a respective parity evaluator circuit 104, and is connected to the same NOR gate in each sub-circuit. GPFAIL is the global parity fail signal generated by parity evaluator circuit 112 and is connected to the same NOR gate in each sub-circuit of all decoder circuits 156 in ECC memory system 100. Those of skill in the art will understand that NOR gate 184 and inverter 186 can be replaced by an equivalent NAND gate, and NAND gate 180 and inverter 182 can be replaced by an equivalent NOR gate to simplify the schematic and reduce component count.

The operation of decoder circuit 156 is now described. In the case where decoder circuit 156 is associated with a memory block 52 that does not report local parity failure, LPFAILn remains at the low logic level as previously described for FIG. 8. Prior to the global parity check, GPFAIL remains at the low logic level to indicate the absence of a global parity failure. As will be described later, parity evaluator circuit 112 functions identically to previously described local parity circuit 106. Therefore all NOR gates 184 of decoder circuit 156 drive inverter 186 with a low logic level, which in turn, drives an input of NAND gate 188 to the high logic level. Now YB0 can be activated to turn on a corresponding column access transistor through the addresses C1, C2, C3 and C4 connected to NAND gate 180. The data of the LDB pairs are coupled to the GDB pairs and the parity evaluator circuit 112 proceeds to check the global parity.

In the case where decoder circuit 156 is associated with a memory block 52 that does report local parity failure, LPFAILn is driven to the high logic level. Prior to the global parity check, GPFAIL remains at the low logic level to indicate the absence of a global parity failure. Therefore all NOR gates 184 of decoder circuit 156 drive inverter 186 with a low logic level, which in turn, drives an input of NAND gate 188 to the high logic level as in the previous case above. YB0 is activated to turn on a corresponding column access transistor through the addresses C1, C2, C3 and C4 connected to NAND gate 180. The data of the LDB pairs are coupled to the GDB pairs and the parity evaluator circuit 112 proceeds to check the global parity.

However, decoder circuit 156 behaves differently in both described cases when global parity failure is detected. GPFAIL is driven to the high logic level when global parity failure is detected. In the first case where there is no local parity failure (LPFAIL=Low), inverter 192 drives its NOR gate inputs to the low logic level, which in turn drives an input of NAND gate 188 to the low logic level. YB0 is then driven to the low logic level to turn off the previously turned on column access transistor. In the second case where there is local parity failure (LPFAIL=High), the changing state of GPFAIL has no effect upon the output of NOR gate 184 since LPFAILn is already at the high logic level. Hence YB0 remains active and its previously turned on column access transistor remains turned on. Now when the GDB pairs are inverted due to the detected global parity failure, only the LDB pair coupled to the GDB pair has its data inverted. The data of the LDB pair can then be written to memory as previously described. Collectively, the decoder circuits 156 permit exactly one column access transistor across all the memory blocks to be activated.

FIG. 9 shows a circuit schematic of the parity evaluator circuit 112 shown in FIG. 4. Parity evaluator circuit 112 is identically configured to the circuit of FIG. 5 except for the input signals connected to it. The components of parity evaluator circuit 112 having the same reference numerals as those same components in FIG. 5 have already been described and hence do not require further description. Specifically, GDB pairs are connected to the four n-channel transistors 126, 128, 130 and 132 within serial parity chain 120, and comparator circuit 124 compares the logic states of EVENPAR and ODDPAR to the logic states of the column parity bit provided via parity block databus lines PBBIT and PBBIT*. The result of this comparison appears as signal GPFAIL. GPFAIL can be a global signal used in each memory block 52 and can be used by the system to initiate other system processes, such as for activating global databus inverting circuit 114. In the present example, comparator circuit 124 drives GPFAIL to the high logic level when global parity failure is detected.

FIG. 10 is a circuit schematic showing global databus inverting circuit 114 connected to the GDB. To simplify the schematic, only two complementary global databus and associated flip-flop circuits 200 are shown, but those of skill in the art will understand that there is one flip-flop 200 for every global databus pair. The global databus inverting circuit 114 has the function of inverting the state of data currently on the GDB in response to a control signal, which is preferably the global parity fail signal GPFAIL. The global databus inverting circuit 114 includes a plurality of standard D-type flip-flops 200, where each flip-flop 200 is connected to one GDB pair. Each flip-flop has a D-input for receiving data, a clock input for receiving a control signal, a Q-output for providing true data and a Qb-output for providing the complement of the data. In the present example, the rightmost flip-flop 200 receives a data signal from GDB0* and has its Q-output connected to GDB0 and its Qb-output connected to GDB0*. The leftmost flip-flop 200 is arranged in the same configuration with GDB1/* as the rightmost flip-flop 200 is with GDB0/*. Both flip-flops 200 receive clocked parity fail signal GPFAIL provided by parity evaluator circuit 112. While D-type flip-flops are used in the present embodiment, other types of flip-flop circuits well known to those of skill in the art can be used instead.

A description of the operation of global databus inverting circuit 114 follows with reference to the rightmost flip-flop 200. GPFAIL is inactive at the low logic level when there is no global parity failure detected and data from GDB0* is latched but prevented from being driven onto the Q and Qb output terminals. When GPFAIL rises to the high logic level after parity evaluator circuit 112 detects global parity failure, the latched true data from the D-input is driven onto GDB0 and the complement of the data is driven onto GDB0*. Accordingly, the data on all global databus lines are inverted by global databus inverting circuit 114. As previously noted, the decoder circuits 156 of the memory blocks 52 that do not have local parity failure prevent the inverted data of the global databus to be written back.

Figure 11:
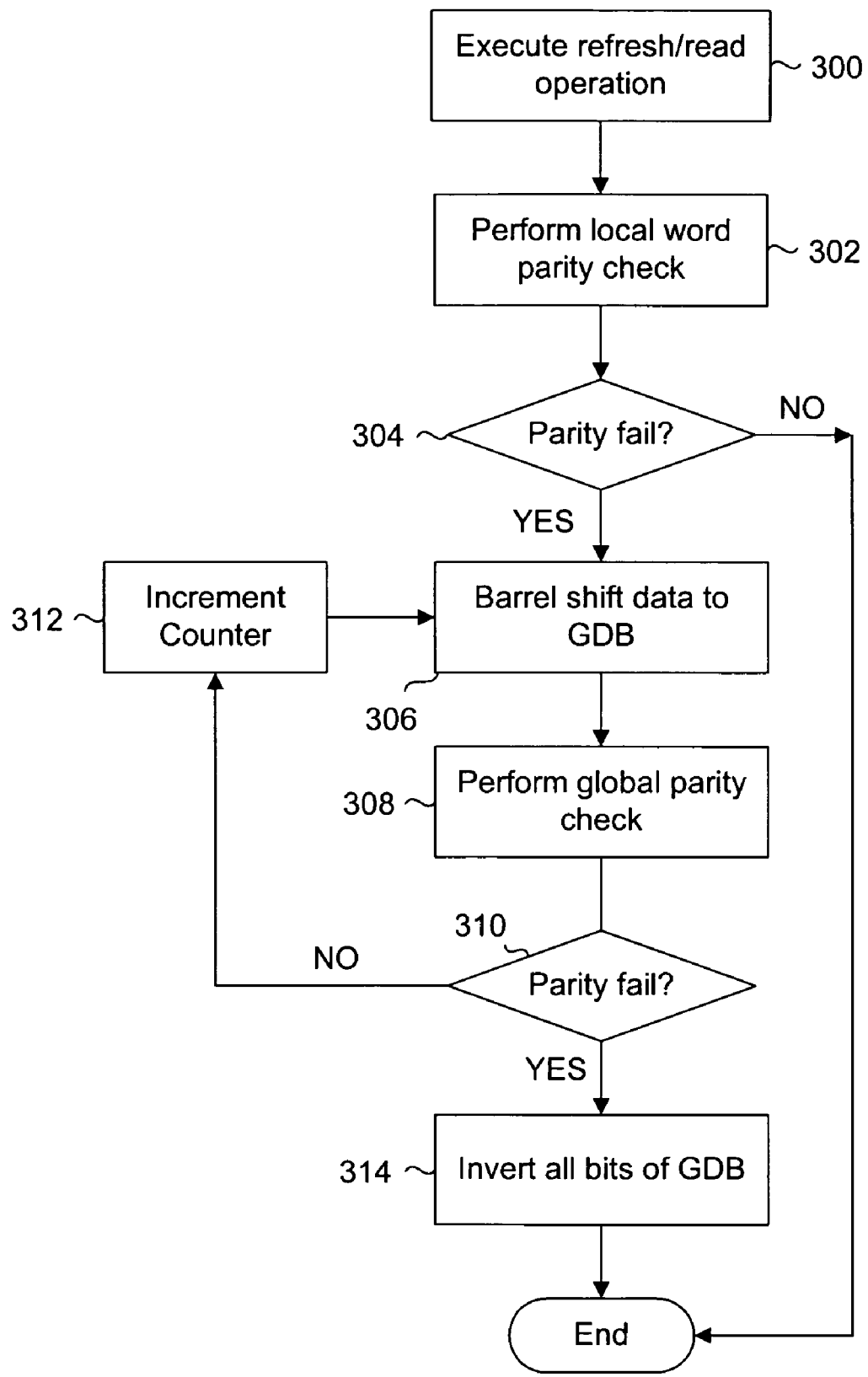
FIG. 11 is a flow chart showing a method of error detection and purging according to an embodiment of the present invention.

The method for performing error detection and correction with the architecture described and shown in FIGS. 4 to 10, follows with reference to the flow chart of FIG. 11. It is assumed that data has been written into the memory array and the parity bits have been generated and stored. It is further assumed that a master wordline and all wordline segments coupled to the master wordline are activated during a read/refresh operation, and the word being accessed in memory block0 contains a faulty bit of data. The process for generating and storing the parity bits is discussed later.

Initiation of the error detection and correction process begins with a refresh or read operation in step 300. This involves activation of the master wordline and corresponding wordline segments of each memory block within the memory array. Hence the sense amplifiers of each memory block are loaded with data. Column decoders control the first stage column access devices 54 to couple one of the 4 bitlines of each group to each of the associated 32 LDB pairs, and the corresponding parity bitline to its parity bit databus pair.

In step 302, a parity check of the LDB against PDB is performed by the parity evaluator circuits 104 of each block, with the respective LPFAILn output carrying the logical result of the parity check, representing the parity of the 32 bit word. If at step 304 there is no parity failure detected, as indicated by a logic "0" level for example, then the error detection and correction process ends and a normal read operation proceeds. If the process was initiated by a refresh operation, then another row segment refresh cycle can be executed.

If row parity failure is detected in memory block0 for example, the error is flagged via local parity fail signal LPFAIL0 and the system alerted that there is bad data, but good data will be available after purging is complete. In this particular example, the local parity circuit can generate a local parity fail signal for later use as a control signal and to indicate that the 32 bit word of that particular block has an error.

A barrel shift operation begins at step 306 to couple the same logical bit position from each set of LDB's to a global databus line. For example, the bit from LDB0 of memory block 0 is coupled to GDB0, the bit from LDB0 of memory block 1 is coupled to GDB1 etc, such that the GDB carries all the 0 position bits from each memory block in a first iteration. The 0 position bit from the LDB's of the parity block is also provided in the same iteration. It is noted that data from the current refresh or read cycle is preferably maintained in the bitline sense amplifiers to avoid having to repeat read out of data. Hence it is preferable to use a DRAM architecture in which an equalize/precharge operation immediately precedes the active cycle rather than after the active cycle is finished.

In step 308, the parity evaluator circuit 112 determines the parity of the GDB's and compares the result with the column parity bit from the parity block. If no parity failure is detected in step 310, the process proceeds to step 312 where the counter 108 is incremented so that another barrel shift iteration can proceed in step 306 for the next bit position.

However, if parity failure is detected in step 310, an error flag GPFAIL is generated and the process proceeds to step 314. Therefore, it has thus been determined that the error has occurred in the present bit position being checked. For example, if the parity failure occurred during a check of all the "0" bit positions, then it is known that bit position "0" of the word with the error is bad.

In step 314, GDB inverting circuit 114 is activated to invert all the data bits of the GDB when global parity failure has been detected via GPFAIL. Because decoder circuit 156 of block0 has LPFAIL0 at the logic "1" level, only its column access signal remains activated. The decoder circuits 156 for all the other blocks having GPFAIL at the logic "1" level and their LPFAILn signals at the logic "0" will have their column access signals disabled. Thus only the LDB belonging to the memory block flagged with the local parity failure remains coupled by the LPFAIL0 flag to its corresponding GDB via its barrel shift decoder/multiplexor 106. Hence just the data of the one LDB is inverted, as is the column it is coupled to. The error is purged and the corrected data is restored in the memory block. It should be noted that for the current iteration, the column decoders and the counter 108 for controlling the first stage column access devices 54 and the barrel shift decoder/multiplexor 106 have not changed since reading out the data for which the row parity failed. Hence the data path to the erroneous column remains active. The memory blocks 52 that did not have the row parity failure will not have generated their own local parity fail signal. Therefore, the barrel shift decoder/multiplexor circuits of these memory blocks will deactivate and prevent the GDB's from asserting the inverted data onto their respective LDB's.

Once the global parity failure has been detected and corrected, the process can terminate. Optionally, the process can loop back to step 312 so that the next bit position of the LDB's is coupled to the GDB's for the column parity check in the subsequent iteration. This optional step can be implemented to detect and correct multiple bit failures.

While the presently described method is applicable to memory architectures where all wordline segments associated with a master wordline are activated during a read operation, an alternate embodiment of the presently described method is applicable to memory architectures where only one wordline segment associated with a master wordline is activated during a read operation. This is a type of low power memory architecture in which memory blocks that are not accessed do not consume bitline and sense amplifier power. However, refresh operations still require activation of all wordline segments associated with the master wordline.

Therefore, in the method according to an alternate embodiment of the present invention, a parity failure detected during read out of data from a single memory block, where only that wordline segment is activated, will initiate a refresh operation to activate all the wordline segments of the currently activated master wordline. To minimize peak power consumption, it is preferable to stagger activation of the wordline segments in a manner well known to those of skill in the art. Once all the wordline segments have been activated, as in a refresh operation in step 300 of FIG. 11, steps 302 to 314 of the method shown in FIG. 11 can proceed to identify the specific bit position of the word to be purged.

The method shown in FIG. 11 is ideally suited for memory architectures that activate all wordline segments of a master wordline during read operations, however, the addition of the previously discussed preceding steps for operating the device in a refresh mode adapts the method for memory architectures that activate only one wordline segment during a read operation.

Therefore, soft errors can be purged during refresh operations in which data is read out to the LDB pairs of each memory block 52, before the next read/refresh cycle is executed. System cycles can be consumed without impacting read performance since no system operation such as a read operation is being delayed. Now errors cannot build up because a read operation has not been executed. However, soft errors can still develop within the period of time between a current read operation and a previous refresh cycle. In such a situation, the error can be flagged and a "wait" required while the error is purged by the serial global parity check process. Because the global parity check is performed serially, only a single set of circuits are required, which reduces overhead, lowers power consumption and use of silicon area versus ECC architectures in which column parity checks are done in parallel.

The previously described circuits of ECC memory system 100 are examples of suitable circuits for executing the error detection and purging method described in the flow chart of FIG. 5. A desired advantage of the embodiment of ECC memory system 100 shown in FIG. 4 is the absence of any additional wide bussing that is currently used in ECC systems of the prior art for carrying corrected data from the global parity check circuit back to the memory blocks 52. The embodiment of the ECC memory system 100 shown in FIG. 4 avoids the use of additional wide bussing by re-using the global data buses and local data buses that are already inherently necessary for normal memory read and write operations. The addition of simple circuits coupled to the local and global databus provides this additional functionality for the local and global databus.

It should be noted that memory system 100 can be limited to include only the row parity circuits 104 for detecting an error in the word being read out. In such a configuration, locating and correcting the erroneous bit position of the word can be determined by an external system, such as a microcontroller block for example. Specifically, the external system can read out the required data from memory system 100, correct the bad bit and rewrite the corrected word back into memory system 100 using any one of a variety of well known data correction techniques. In the present circuit, the flag signal LPFAIL can signal the external system to initiate error purging operations. Furthermore, as row parity circuit 104 has the capability to generate and write a row parity bit in parallel with a word being written, write operations can proceed quickly and automatically.

It should be further noted that the column parity circuit embodiments of the present invention use as many global dataline pairs as there are memory blocks for storing words. For example, if the global databus is 16 bits wide, and there are eight memory blocks 52 in memory system 100, only eight global databus line pairs are used during the column parity circuit operation. In particular, only those global dataline pairs connected to a barrel shift decoder/multiplexor circuit 106 are connected to the parity evaluator circuit 112 for column parity evaluation. Accordingly, if memory system 100 has more memory blocks 52 than available global dataline pairs, then additional dedicated dataline pairs can be included to receive the data from the barrel shift decoder/multiplexor circuits 106 of the 'excess' memory blocks.

The previously discussed embodiments of the present invention for detecting and purging faulty bits relies upon the use of row and column parity bits in order to determine the occurrence and location of a faulty bit of data. Since bits of data can be changed during write operations, the corresponding row and column parity bits may no longer correctly reflect the parity of the new data. While these parity bits can be generated off chip, or in a processor block of an ASIC device, and subsequently written directly to the parity columns 26 and the parity block 110, the additional circuit and processor cycle overhead to read out data and write in parity data renders such schemes impractical. Therefore, it is preferable to generate the parity bits locally within the domain of the memory circuits since the data required for generation of parity bits resides in the memory blocks.

According to an embodiment of the present invention, row and column parity bits can be generated within memory system 100, and written to the parity column 102 and parity block 110 respectively, as data is being written. However, it is important to note that the logic states of the row and column parity bits is dependent upon known states of data. While generation of a row parity bit corresponding to a newly written word of data can be executed in a straightforward manner, as will be described later, generating a corresponding column parity bit requires that the logic states of words of data associated with the same activated wordline are effectively known. Since memory cells store random data upon power up, it is necessary to initialize all the memory cells to a known state prior to any write operation.

According to another embodiment of the present invention, all the memory cells of the memory system 100 are initialized to a "0" logic state such that all words are set to the null (logic "0") state, and the logic "0" state of all row and column parity bits will correctly reflect the parity of null words stored in the memory blocks. Alternatively, all the memory cells of the memory system 100 can be initialized to a "1" logic state.

Figure 12:
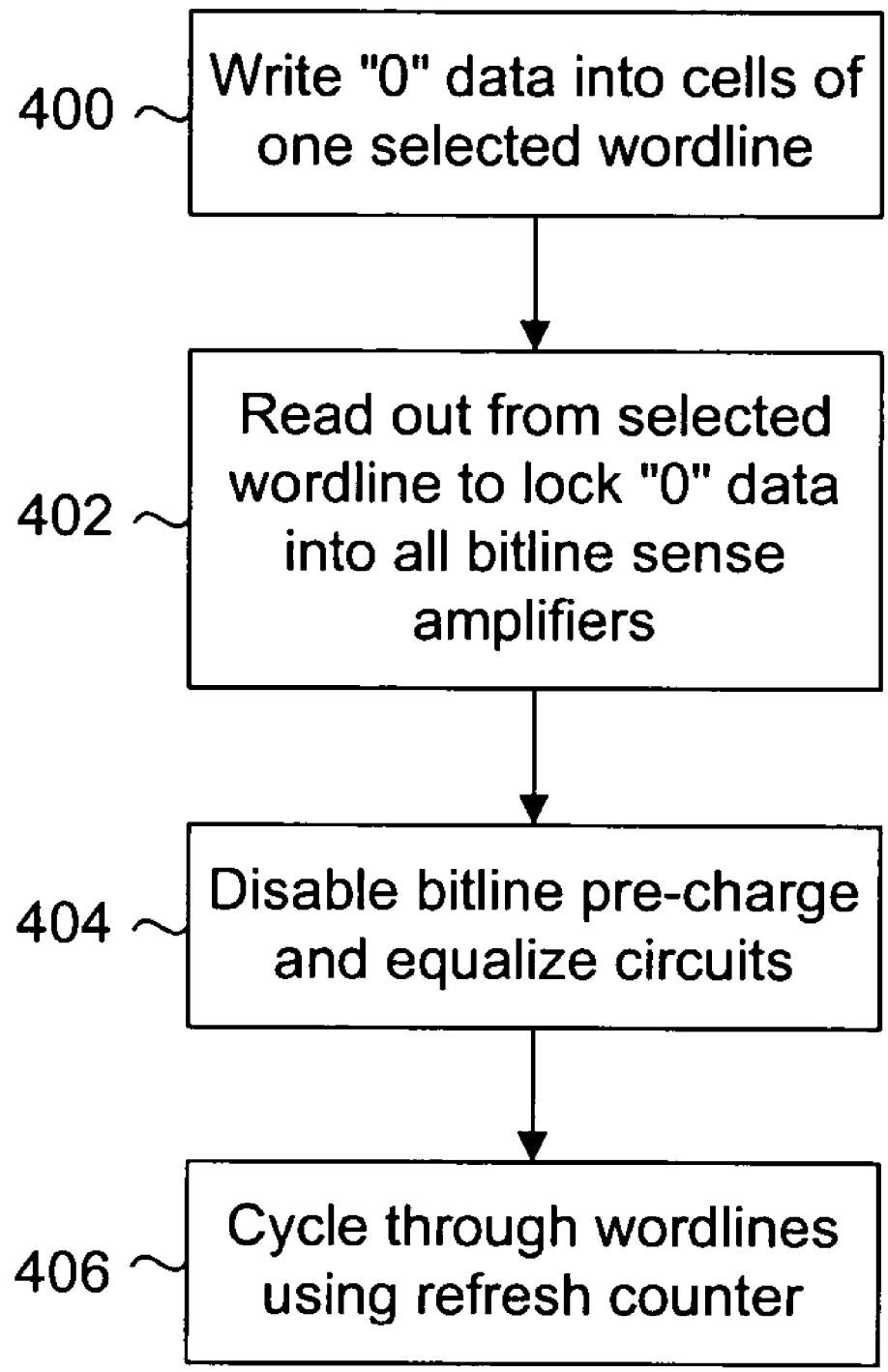
FIG. 12 is a flow chart showing a method of initializing a memory according to an embodiment of the present invention.

FIG. 12 is a flow chart illustrating a method of initializing the memory cells of memory system 100 according to an embodiment of the present invention. Assuming that a traditional power up sequence has been completed to initialize the circuits, the memory initialization sequence of FIG. 12 can commence at step 400. At step 400, "0" logic data is written to the memory cells of an activated wordline via a typical write operation. While one word is written during a typical write operation, according to the present embodiment, all the first and second stage column access devices 54, 58 of all memory blocks 52, 110 can be simultaneously activated to couple the "0" logic data presented on the global data bus to every column of each memory block 52, 110 simultaneously. Those of skill in the art will understand that the column decoder circuits can be configured to simultaneously activate all access devices under the control of a single "activate all" control signal. After the "0" logic state is written to all the memory cells coupled to the active wordline, a read access of the cells coupled to the previously written wordline is performed at step 402 to load/latch all the bitline sense amplifiers with the "0" logic state data. The bitline precharge and equalize circuits are then disabled in step 404 in preparation for step 406. Using existing refresh counters that control wordline activation, each wordline is iteratively activated to couple its memory cells to the bitline sense amplifiers via bitlines. With the bitline sense amplifiers latching the "0" logic state, the memory cells will be restored, or re-written, with "0" logic data. Because all the bitline sense amplifiers of each memory block 52, 110 have latched the "0" logic state in step 402, the refresh counter only needs to cycle once through all the wordlines. Those of skill in the art will understand that the bitline precharge and equalize circuits are disabled during the presently described refresh operation to ensure that the bitline sense amplifiers overwrite the bitline voltage potential introduced by the memory cells. Techniques for disabling the bitline precharge and equalize circuits should be well known to those of skill in the art.

While the presently described embodiment writes the logic "0" level to all the cells of an activated wordline in step 400, multiple write operations can be executed to successively write null value words to the same wordline by maintaining the same row address while changing column address in each cycle. Those of skill in the art will understand that other methods can be devised to write the logic "0" state to the initial activated wordline, and that the current method can be adapted for different memory configurations. Of course, the memory initialization sequence of FIG. 12 is not limited to being executed as part of a power up reset sequence, and can be executed at any time it is desired to clear the memory of its contents. As the memory initialization sequence of the present embodiment is directed to DRAM memory, alternate embodiments can be directed to different types of memories with the appropriate variations to account for the specific technology involved. For example, standard SRAM does not require refresh operations, hence the wordlines can be activated through external address control.

After the memory blocks 52, 110 have been initialized, write operations can proceed, with automatic generation and writing of row and column parity bits corresponding to the written words. A method for generation and writing of row and column parity bits according to an embodiment of the present invention is shown in FIG. 13.

Figure 13:
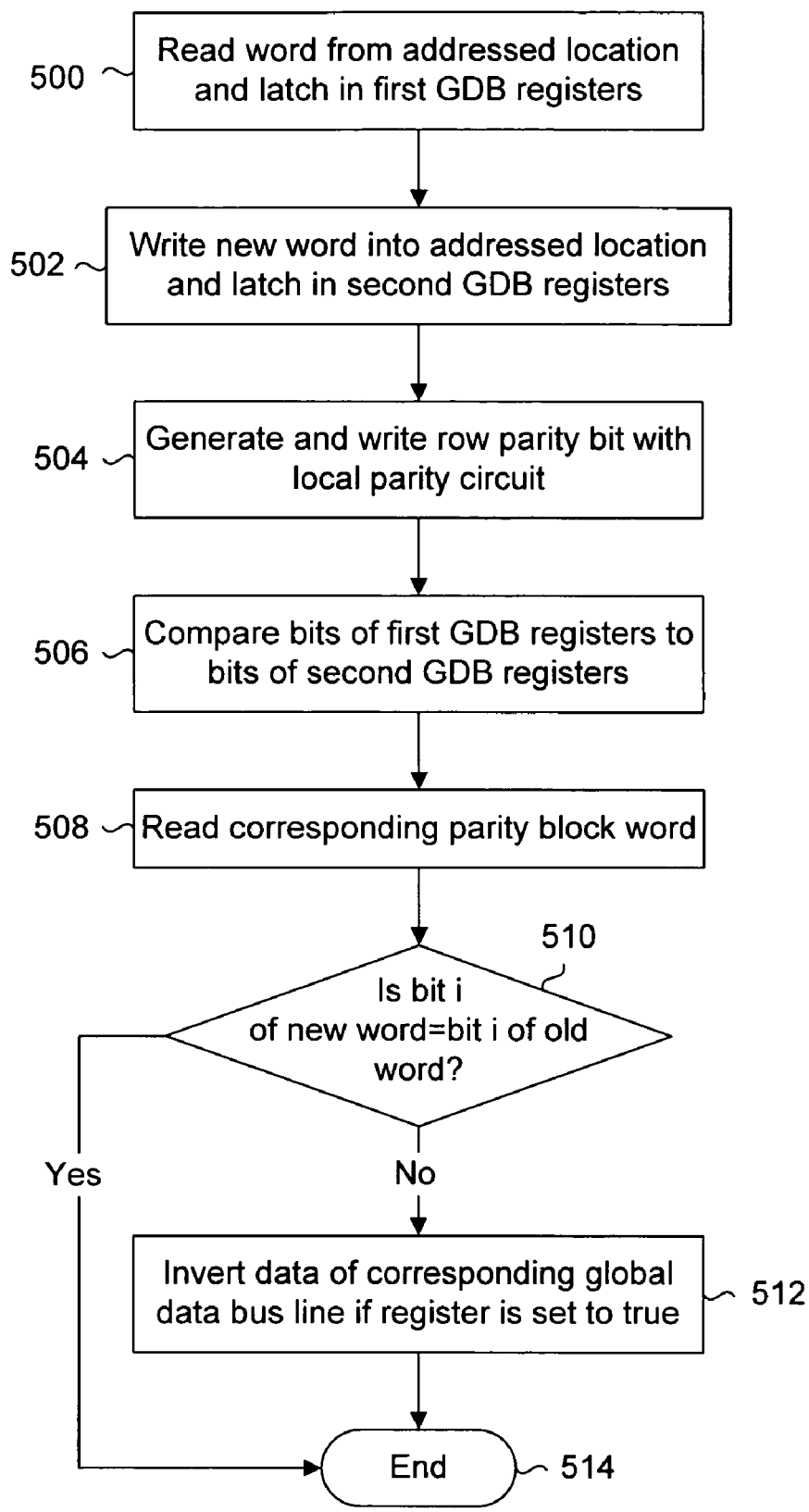
FIG. 13 is a flow chart showing a method of generating and writing row and column parity bits according to an embodiment of the present invention; and, FIG. 14 is a circuit schematic of a column parity check circuit according to an embodiment of the present invention.

Generally, the method of FIG. 13 defines a single write operation for the memory system 100 shown in FIG. 4 that automatically generates a new corresponding row parity bit and selectively modifies corresponding column parity bits as required, when new data is written. Specifically, each bit of the newly written word is compared to each corresponding bit of the currently stored word to determine if there is a change in the logic state of the bit in the new word. A change in logic state changes the logic state of the corresponding currently stored column parity bit for that bit position. The present method makes use of the memory circuit infrastructure to minimize the addition of bus lines. The presently described method only examines the bits of the written word to determine if column parity bits need to be changed, and does not require cumbersome reading of the associated words that collectively define the state of each column parity bit.

The write operation starts at step 500 with a read access, where the row address to be written to is accessed and the current word stored therein is read out to the global databus. A column parity check circuit having a first set of registers coupled to the global databus latches the data for use in a subsequent step. It is noted that the data on the global databus does not proceed to the output path circuits as this is not a true read operation.

At step 502 the new word data is asserted onto the global databus and written to the addressed memory block. A second set of registers of the column parity check circuit coupled to the global databus latches the data for use in a subsequent step.

In step 504, the parity evaluator circuit 104 coupled to the LDB will generate an output from sense amplifier 140 of FIG. 6 reflecting the row parity of the LDB data being written to the memory block 52. More specifically with reference to FIGS. 6 and 7, additional logic can be added to disable XOR gate 148 during write operations, and gating logic can be added to couple the outputs of cross-coupled latch 140 to PDB and PDB* during write operations. This logic adds minimal circuitry to each parity evaluator circuit 104, and can be implemented with well known circuits configured in a manner known to those of skill in the art.

At step 506, each bit position stored in the first and second set of registers are compared to each other to determine if a bit of the new word is the same or different than the corresponding bit of the old word. A flag indicating a match or mismatch of the comparison can be set for each bit position in step 506.

Proceeding to step 508, the corresponding parity word is accessed from parity block 110 and read out onto the global databus. It is noted that the old word read out in step 500, the new word written in step 502, and the parity word of the present step are activated by the same wordline addressed in the current write operation. Each bit position of the parity word represents column parity for that bit position of all words in the other blocks 52 accessible by the same row and column address.

In step 510, the flags set in step 506 are used to activate inverting circuits of the column parity check circuit coupled to the global databus. Any inverting circuit receiving a flag will invert the data on its corresponding databus line in step 512, and any inverting circuit that does not receive the flag will not change the data on its corresponding databus line, ending the process at step 514. Any changes to the global databus are propagated back to the parity block 110, where those bitlines coupled to changed global databus lines rewrite the data of its corresponding memory cell.

As previously mentioned, parity evaluator circuits 104 that are used to check parity of a word that is read out can be used to generate the corresponding row parity bit as the new word is written to its memory block 52. The comparator circuit of FIG. 6 can be modified to include gating devices to switch PDB from the input of XOR gate 148 to the output of sense circuit 140, and to disconnect the output of sense circuit 140 from the other input of XOR gate 148 during the write operation. A circuit embodiment of a column parity check circuit that can be used in accordance with the method of FIG. 13 is shown in FIG. 14.

Figure 14:
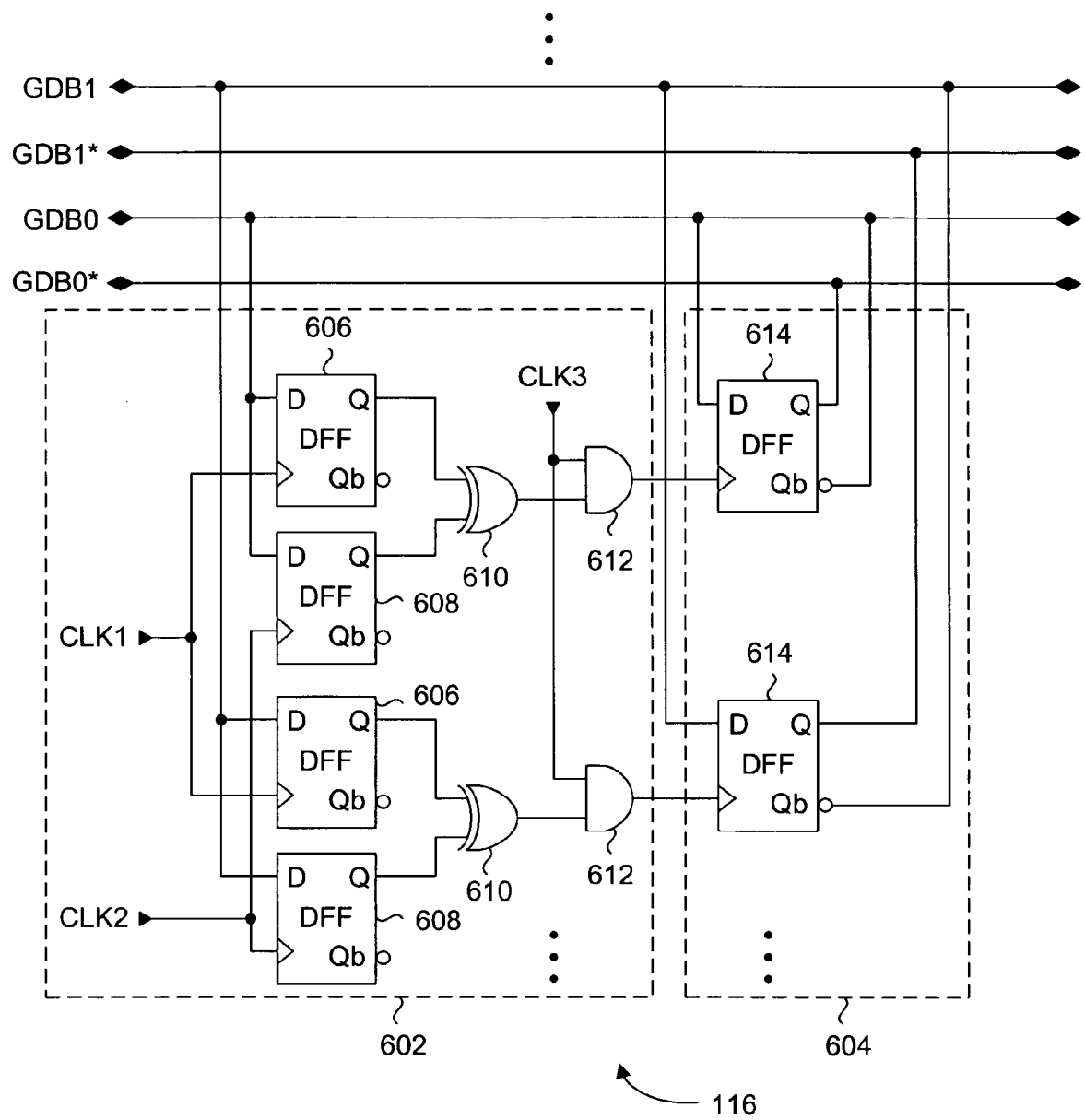

The column parity check circuit embodiment of FIG. 14 is coupled to the global databus for comparing old stored data words to new write data words, and selectively inverting the datalines corresponding to bit positions having mismatching data. Column parity check circuit 116 includes a parity comparison circuit 602 and a parity inverting circuit 604. The parity comparison circuit 602 latches an old stored data word and a new write data word, and provides flag signals indicative of a mismatch between individual bit positions. The parity inverting circuit 604 inverts global datalines in response to received flag signals. Two global dataline pairs and corresponding circuits are shown in FIG. 14 to illustrate the circuit configuration of the column parity check circuit, however, any person of skill in the art should understand that the presently shown circuit embodiment can be scaled to accommodate any number of global dataline pairs.

Parity comparison circuit 602 includes a first set of GDB registers 606 that are each connected to receive and latch a respective global dataline logic level in response to a first clock signal CLK1, and a second set of GDB registers 608 that are each connected to receive and latch a respective global dataline logic level in response to a second clock signal CLK2. Each first register 606 and second register 608 receiving the same global dataline signal form a comparison pair, and their outputs are provided to an associated XOR gate 610. An AND logic gate 612 associated with each comparison pair receives the output of a XOR gate 610, and passes the XOR gate 610 output in response to clock signal CLK3.

Parity inverting circuit 604 includes D-type flip-flops 614 having their inputs and outputs connected to the global datalines in a configuration similar to global dataline inverting circuit 114 shown in FIG. 10. The clock input of flip-flops 614 receive an output from AND gate 612 to receive and latch respective global dataline signals.

The operation of column parity check circuit 116 is now described with reference to the steps described in FIG. 13. It is assumed that all the clock signals CLK1, CLK2 and CLK3 are presently inactive. The first set of GDB registers 606 latch the data accessed from the addressed location in step 500, in response to an active CLK1 signal. Thus the Q-output of each register 606 is provided to an input of associated XOR gate 610. Subsequently, the second set of GDB registers 608 latch the new data to be written to the addressed location in step 502, in response to an active CLK2 signal. The Q-output of each register 608 is provided to the other input of the associated XOR gate 610. The active level output of each XOR gate 610 can be considered the flag indicative of a mismatch. In the present example, the active level is a high logic level if the Q-outputs of the comparison pairs are at different logic levels. The parity block word is read out to the global datalines in step 508, and CLK3 is set to the active level to pass the output of each XOR gate 610 to registers 614. Any flip-flop register 614 receiving an active XOR gate 610 output will latch and invert the data of its corresponding dataline pair. Conversely, any flip-flop 614 that does not receive an active XOR gate 610 output will not latch and invert its dataline pair. CLK1, CLK2 and CLK3 are activated in sequence and with sufficient delay between each other to allow the global dataline pairs to be properly reset and stabilize with data. The first and second stage column access devices 54, 58 associated with parity block 110 can remain active to allow the changed logic states of the global dataline pairs to propagate back to the memory cells. After the bits of the parity block word are written back to memory, the activated wordline is deactivated, and the write operation is completed. Therefore, new row and column parity bits can be generated automatically and independent of any systems external to the embedded memory in response to new data being written to memory system 100. The memory system 100 can be controlled by write control circuits (not shown) that can be implemented by any person of skill in the art.

The error correction and purging scheme disclosed is well suited to incorporation in embedded DRAM systems to reduce cell size and cost while simultaneously increasing robustness against soft errors or random miss-reads. Fault tolerance is further improved by incorporating well known redundancy techniques to replace defective memory cells with new memory cells, and then using the error correction and purging system of the present invention to correct soft errors that may occur in either the normal memory cells or the new memory cells. Adding redundancy to the memory configuration shown in the figures should be straight forward to those of skill in the art. For example, extra rows are completely independent, and a 4-column data bus strip for each segment can be mapped in a straightforward manner. Furthermore, the single bit row parity bit is independent of word length and the single bit column parity bit is independent of the number of words associated with the same master wordline, unlike Hamming code error correction schemes where the required number of error correction bits depends upon the word length.

While the previously described embodiments of the present invention are directed to DRAM, and in particular embedded DRAM, they can apply to other types of memories such as SRAM, ferro-electric RAM (FeRAM), and other non-volatile memories. These alternate memories are also susceptible to bit errors, and can benefit from automatic error detection, purging and parity bit generation. As should be obvious to one of skill in the art, circuits and control algorithms specific to a type of memory and its architecture can be adapted to integrate the error correction and purging techniques disclosed. For example, since SRAM does not require refreshing operations, a data purge operation can be periodically executed to initiate a 'refresh-type' operation to search and correct bad bits in the memory. Accordingly, the data word can be suppressed from global I/O circuits to prevent the data word from appearing on an I/O pad or output line. Alternatively, once row parity failure has been indicated, the external system can ignore the data word presented on its output. For non-volatile memories, re-writing corrected data to the memory cells will require application and control of bias voltages to inject or remove charge from floating gates of the memory cells.

Minimal additional silicon area is used by the parity circuit and column parity check circuit embodiments of the present invention because they are formed in the local and global databus routing areas, and the size of the global parity circuit is minimized because the global parity check is performed serially with one set of circuits. The performance impact of the ECC circuits is minimal because errors can be detected and purged during refresh cycles in addition to read cycles. Hence the problem of errors building up while data is stored but not accessed is effectively eliminated, and read operations can be executed without any significant performance penalty. Furthermore, the ECC scheme embodiment of the present invention allows for repair of hard faults by traditional redundancy techniques with minimal design overhead.

Enhanced reliability and lower cost is achieved through use of the error correction and purging scheme embodiments of the invention, as memory cells can be deliberately arranged to store data with very little charge and thus high susceptibility to soft errors or simple miss-reads after a longer period between refreshes. Additionally, lower power consumption can result from the use of longer refresh intervals.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method of detecting and purging bit errors in a memory, comprising:
   a) executing a read operation for providing a data word to a local databus and for providing a corresponding row parity bit, from a memory block of the memory;
   b) comparing row parity of the data word on the local databus against the corresponding row parity bit and generating a row parity fail flag in response to row parity failure;
   c) iteratively multiplexing bits of the data word from the local databus onto a corresponding global dataline for comparing column parity of each bit of the data word against a corresponding bit of a column parity word stored in a parity block of the memory, in response to the row parity fail flag; and,
   d) inverting bits of the data word that fail column parity.

2. The method of claim 1, wherein the step of executing includes suppressing the data word from global I/O circuits.

3. The method of claim 1, wherein the step of comparing row parity includes executing a row parity check of the local databus against the corresponding row parity bit.

4. The method of claim 1, wherein the step of comparing column parity includes executing a column parity check of the global datalines against a corresponding column parity bit in each iteration.

5. The method of claim 4, wherein the step of comparing column parity includes inverting the data bits of the global datalines if column parity failure is detected in each iteration.

6. The method of claim 5, wherein the step of inverting includes inverting the data bit of a local databus line coupled to one of the global data lines for purging the bit error of the data word stored in the memory block.

7. The method of claim 1, wherein the background read operation includes a refresh operation.

8. The method of claim 1, wherein the background read operation includes a data purge operation.

9. The method of claim 1, wherein the step of iteratively multiplexing includes selectively activating column access transistors for coupling a different local databus line to the corresponding global dataline in each iteration.

10. The method of claim 1, wherein the step of selectively activating includes incrementing a counter to address and activate a different column access transistor in each iteration.

11. The method of claim 10, further including maintaining activation of the column access transistor corresponding to the memory block having row parity failure.

12. An error detection and purging system for a dynamic random access memory comprising:
   a plurality of memory blocks for storing data words and corresponding row parity bits, one of the memory blocks being a parity block for providing a column parity word;
   a local data I/O circuit coupled to each memory block for transferring the data words to global datalines;
   a row parity circuit coupled to the local data I/O circuit of each memory block for receiving the data words and the corresponding row parity bits in a memory block access operation, and for comparing parity of the data words against the corresponding row parity bits for generating a corresponding active local parity fail flag in response to row parity failure; and,
   a column parity circuit coupled to all the local data I/O circuits, the global datalines, and the parity block for receiving the data words and the column parity word, the column parity circuit iteratively transferring a bit from each of the data words to a different global dataline for comparing parity of the global datalines to a corresponding bit of the column parity word, the column parity circuit inverting data of the global datalines in response to column parity failure in each iteration.

13. The error detection and purging system of claim 12, wherein each row parity circuit includes
   a serial parity chain for receiving the data word from the local data I/O circuit and for providing a parity output corresponding to parity of the data word, and
   a sense circuit for receiving the parity output and the corresponding row parity bit, for providing the active local parity fail flag if the parity output and the corresponding row parity bit mismatch.

14. The error detection and purging system of claim 13, wherein the serial parity chain includes
   an even parity line driven to a first logic level at one end, and
   an odd parity line driven to a second logic level at one end, the parity output being provided from the other end of the even parity line, and each parity circuit includes cross-over transistors for coupling the parity output to one of the first and second logic levels.

15. The error detection and purging system of claim 14, wherein the sense circuit includes a cross-coupled latch for receiving and latching the parity output, and a comparator circuit for comparing the latched parity output to the local row parity bit.

16. The error detection and purging system of claim 15, wherein the comparator circuit includes an exclusive OR gate.

17. The error detection and purging system of claim 12, wherein each memory block includes one of redundant rows and columns, and corresponding redundancy circuits.

18. The error detection and purging system of claim 12, wherein the parity block has a configuration identical to that of each memory block, and a parity block data I/O circuit for coupling bits of the column parity word to the column parity circuit.

19. The error detection and purging system of claim 18, wherein the column parity circuit includes
- a multiplexor circuit coupled between each local data I/O circuit and the global datalines for receiving the bits of the data word and for iteratively providing each bit of the data word to the global datalines,
- a parity block multiplexor circuit coupled to the parity block data I/O circuit for receiving the bits of the column parity word and for providing one bit of the column parity word in each iteration,
- a parity evaluator circuit coupled to the global datalines and for receiving the one bit of the column parity word, the parity evaluator circuit comparing parity of the global datalines to the one column parity bit in each iteration and generating an active global parity fail flag in response to column parity failure, and
- a global dataline inverting circuit for receiving and inverting data of the global datalines in response to the active global parity fail flag.

20. The error detection system of claim 19, wherein the multiplexor circuit and the parity block multiplexor circuit each include a counter.

21. The error detection and purging system of claim 19, wherein the global dataline inverting circuit includes
- a flip-flop having an input coupled to one global dataline, an output coupled to a complementary global dataline of the one global dataline, a complementary output coupled to the one global dataline, and a clock input for receiving the active global parity fail flag.

22. The error detection and purging system of claim 12, further including a column parity check circuit for selectively changing bits of the column parity word on the global datalines in a write operation, for writing a new word to an address of the data word stored in the memory block, the column parity check circuit including,
- a parity comparison circuit for storing the data word and the new word and comparing each bit position of the stored data word to each corresponding bit position of the stored new word, the parity comparison circuit providing a mismatch flag signal for each bit position having mismatching logic states, and
- a parity inverting circuit coupled to the global datalines and for receiving the mismatch flag signals, the parity inverting circuit inverting the logic state of the global datalines in response to the corresponding received mismatch flag signals.

\* \* \* \* \*

UNITED STATES PATENT AND TRADEMARK OFFICE
CERTIFICATE OF CORRECTION

PATENT NO. : 7,266,747 B2
APPLICATION NO. : 10/694761
DATED : September 4, 2007
INVENTOR(S) : Richard Foss Page 1 of 1

It is certified that error appears in the above-identified patent and that said Letters Patent is hereby corrected as shown below:

Column 24, line 21, claim 10, delete "claim 1" and insert therefor --claim 9--

Signed and Sealed this

Twenty-fifth Day of March, 2008

JON W. DUDAS
*Director of the United States Patent and Trademark Office*